US012744071B2

(12) United States Patent
Chung et al.

(10) Patent No.: US 12,744,071 B2
(45) Date of Patent: Sep. 22, 2026

(54) MEMORY DEVICE INCLUDING IN-MEMORY OPERATION CIRCUIT AND OPERATING METHOD THEREOF

(71) Applicant: Samsung Electronics Co., Ltd., Suwon-si (KR)

(72) Inventors: Yoonyoung Chung, Pohang-si (KR); Suwon Seong, Pohang-si (KR)

(73) Assignees: SAMSUNG ELECTRONICS CO., LTD.; POSTECH Research and Business Development Foundation

( * ) Notice: Subject to any disclaimer, the term of this patent is extended or adjusted under 35 U.S.C. 154(b) by 112 days.

(21) Appl. No.: 18/985,730

(22) Filed: Dec. 18, 2024

(65) Prior Publication Data

US 2025/0226019 A1 Jul. 10, 2025

(30) Foreign Application Priority Data

Jan. 5, 2024 (KR) ........................ 10-2024-0002446
May 20, 2024 (KR) ........................ 10-2024-0065356

(51) Int. Cl.
*G11C 11/405* (2006.01)
*G11C 7/16* (2006.01)
(Continued)

(52) U.S. Cl.
CPC .............. *G11C 11/405* (2013.01); *G11C 7/16* (2013.01); *G11C 11/4085* (2013.01); *G11C 11/4091* (2013.01); *G11C 11/4096* (2013.01)

(58) Field of Classification Search
CPC ..... G11C 11/405; G11C 7/16; G11C 11/4085; G11C 11/4091; G11C 11/4096;
(Continued)

(56) References Cited

U.S. PATENT DOCUMENTS 10,825,510 B2 11/2020 Jaiswal et al.
10,915,249 B2 2/2021 Lea
(Continued)

FOREIGN PATENT DOCUMENTS

CN 115831185 A 3/2023
CN 116227564 A 6/2023
(Continued)

OTHER PUBLICATIONS

Belmonte, Attilio, et al. "Lowest I OFF< 3×10−21 A/μm in capacitor-less DRAM achieved by reactive ion etch of IGZO-TFT." 2023 IEEE Symposium on VLSI Technology and Circuits (VLSI Technology and Circuits). IEEE, 2023.
(Continued)

*Primary Examiner* — Tuan D Nguyen
(74) *Attorney, Agent, or Firm* — Muir Patent Law, PLLC

(57) ABSTRACT

A memory device includes an in-memory operation circuit connected to a write word line, a plurality of write bit lines, a read word line, and a read bit line, and including bit cells. Each of the plurality of bit cells includes a first transistor having one end connected to a corresponding write bit line, the other end connected to a storage node, and a gate terminal connected to the write word line, and at least one second transistor having one end connected to the read bit line, the other end connected to the read word line, and a gate terminal connected to the storage node. A current value of turn-on current of the at least one second transistor included in each of the bit cells corresponds to a value obtained by multiplying a reference current value by a power of 2 that is different for each of the bit cells.

20 Claims, 21 Drawing Sheets

1

(51) Int. Cl.

| | |
|---|---|
| ***G11C 11/408*** | (2006.01) |
| ***G11C 11/4091*** | (2006.01) |
| ***G11C 11/4096*** | (2006.01) |

(58) Field of Classification Search

CPC ..... G11C 8/16; G11C 7/1006; G11C 11/4097; G11C 11/403

See application file for complete search history.

(56) References Cited

U.S. PATENT DOCUMENTS

| | | | |
|---|---|---|---|
| 2020/0210369 | A1 | 7/2020 | Song |
| 2023/0317176 | A1 | 10/2023 | Kurokawa et al. |

FOREIGN PATENT DOCUMENTS

| | | | |
|---|---|---|---|
| CN | 116705100 | A | 9/2023 |
| CN | 116913335 | A | 10/2023 |

OTHER PUBLICATIONS

Hu, Qianlan, et al. "True Nonvolatile High-Speed DRAM Cells Using Tailored Ultrathin IGZO." Advanced Materials 35.20 (2023): 2210554.

Kim Hyunjoon, et al. "A 1-16b reconfigurable 80Kb 7T SRAM-based digital near-memory computing macro for processing neural networks." IEEE Transactions on Circuits and Systems I: Regular Papers 70.4 (2023): 1580-1590.

Kim, Ji Hoon, et al. "Z-PIM: A sparsity-aware processing-in-memory architecture with fully variable weight bit-precision for energy-efficient deep neural networks." IEEE Journal of Solid-State Circuits 56.4 (2021): 1093-1104.

Yu, Chengshuo, et al. "A logic-compatible eDRAM compute-in-memory with embedded ADCs for processing neural networks." : IEEE Transactions on Circuits and Systems—I: Regular Papers, vol. 68, No. 2, Feb. 2021; 667-679.

Figure 1:
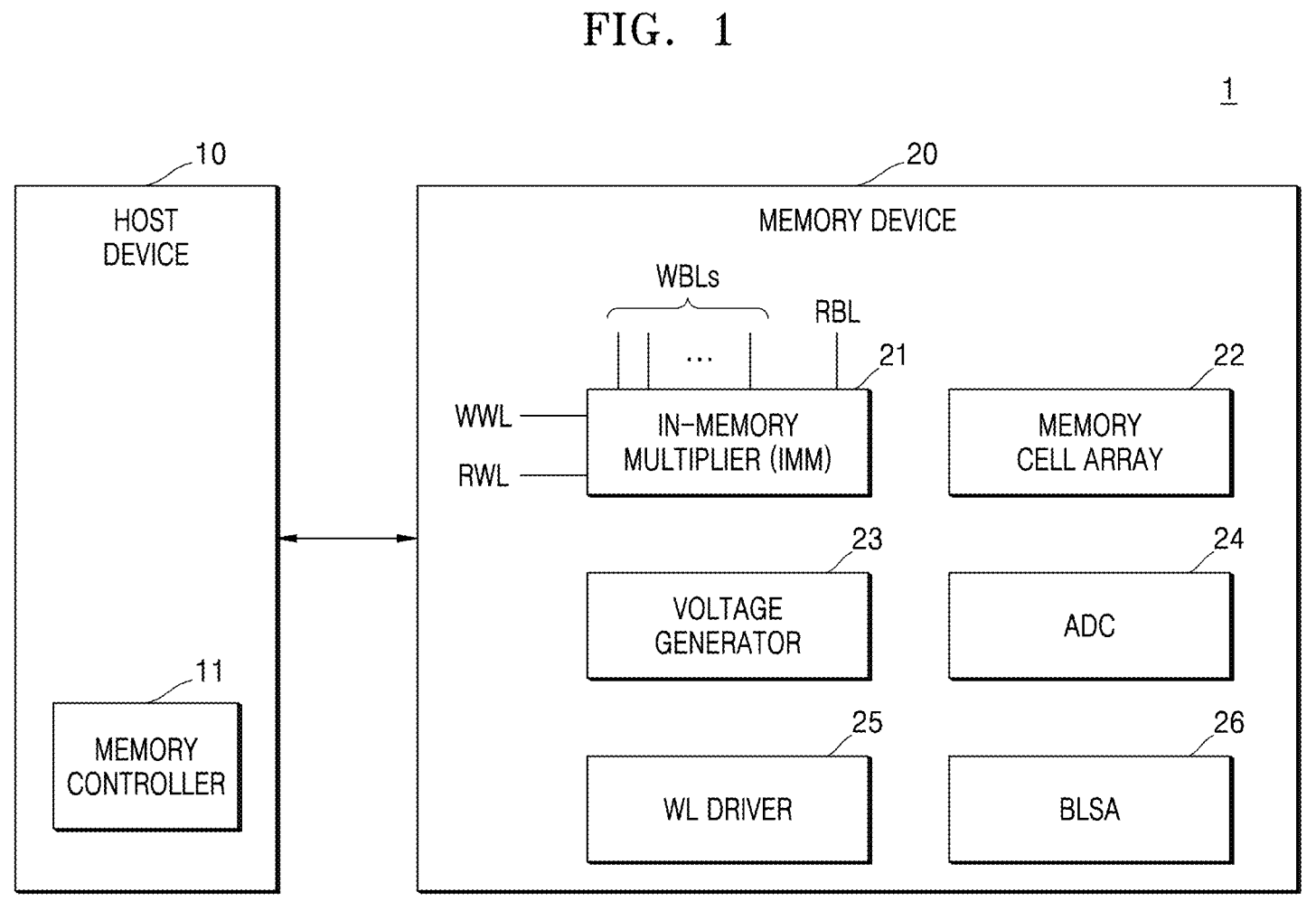

10
HOST DEVICE

11
MEMORY CONTROLLER

20
MEMORY DEVICE

21
IN-MEMORY MULTIPLIER (IMM)

WBLs

...

RBL

WWL

RWL

22
MEMORY CELL ARRAY

23
VOLTAGE GENERATOR

24
ADC

25
WL DRIVER

26
BLSA

Figure 9:
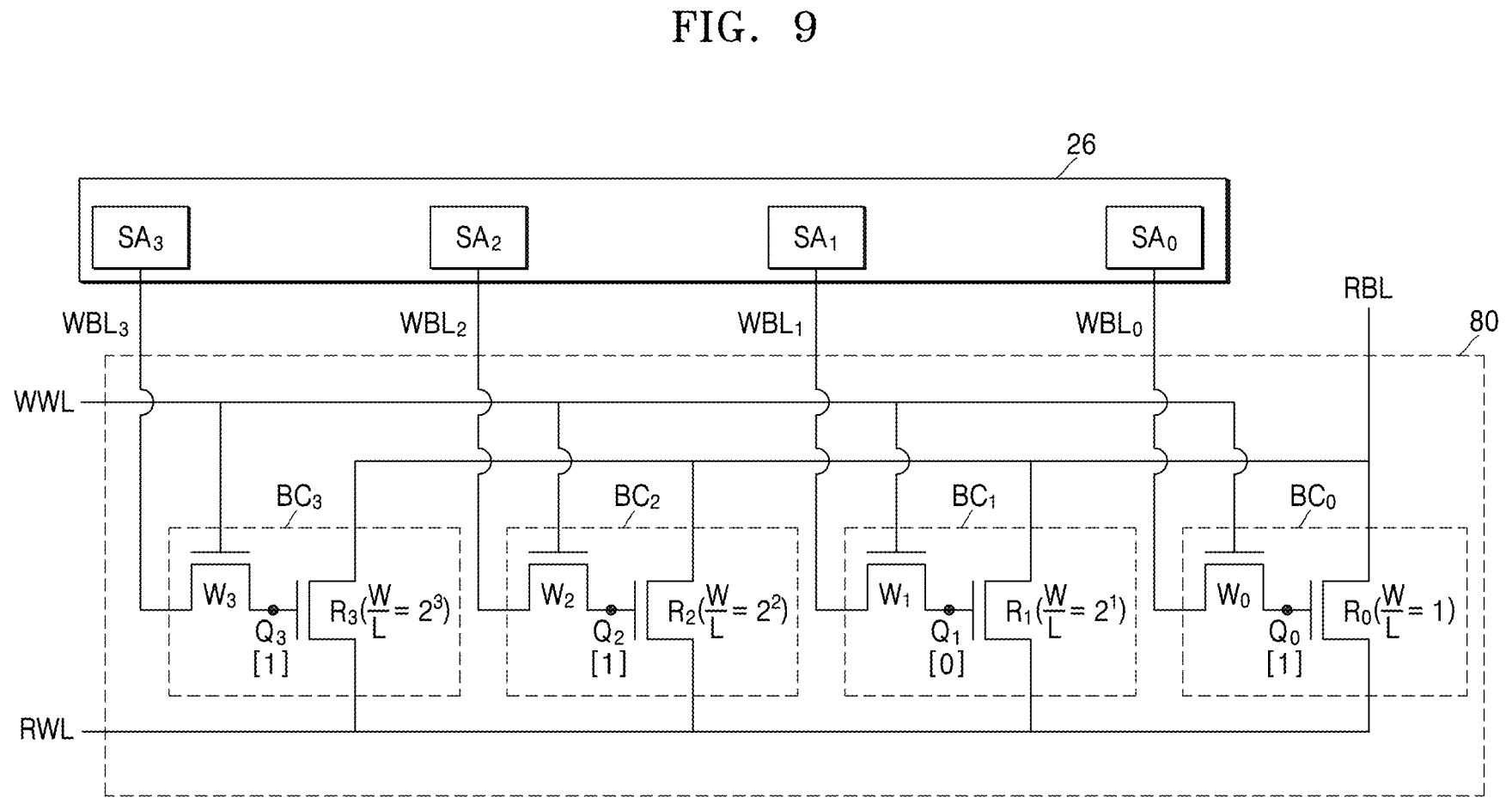

RBL

WWL

RWL $SA_0$ $SA_1$ $SA_2$ $SA_3$ $WBL_0$ $WBL_1$ $WBL_2$ $WBL_3$ $BC_0$ $BC_1$ $BC_2$ $BC_3$ $W_0$ $W_1$ $W_2$ $W_3$ $Q_0$ [1]

$Q_1$ [0]

$Q_2$ [1]

$Q_3$ [1]

$R_0(\frac{W}{L} = 1)$ $R_1(\frac{W}{L} = 2^1)$ $R_2(\frac{W}{L} = 2^2)$ $R_3(\frac{W}{L} = 2^3)$

Figure 14:
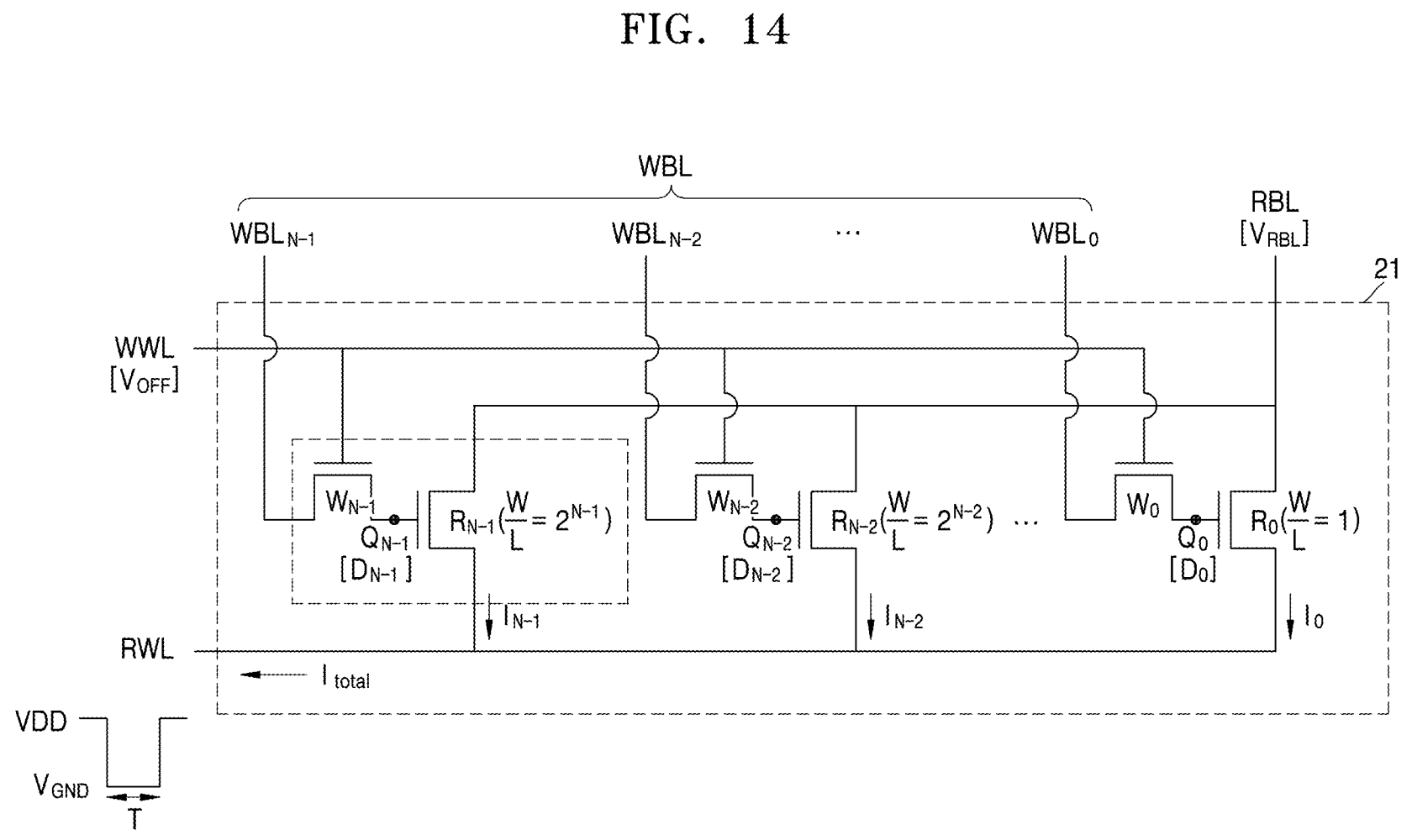

RBL [$V_{RBL}$]

WBL $WBL_0$ $WBL_{N-2}$ $WBL_{N-1}$

WWL [$V_{OFF}$]

RWL

VDD $V_{GND}$

T $R_0(\frac{W}{L}=1)$ $I_0$ $Q_0$ [$D_0$]

$W_0$ $R_{N-2}(\frac{W}{L}=2^{N-2})$ $I_{N-2}$ $Q_{N-2}$ [$D_{N-2}$]

$W_{N-2}$ $R_{N-1}(\frac{W}{L}=2^{N-1})$ $I_{N-1}$ $Q_{N-1}$ [$D_{N-1}$]

$W_{N-1}$ $I_{total}$

80
RBL
[V_RBL]
WBL
WBL_0
WBL_1
WBL_2
WBL_3
W_0
W_1
W_2
W_3
Q_0
Q_1
Q_2
Q_3
[1]
[0]
[1]
[1]
R_0(W/L = 1)
R_1(W/L = 2^1)
R_2(W/L = 2^2)
R_3(W/L = 2^3)
I_0
I_1
I_2
I_3
I_total
WWL
[V_OFF]
RWL
VDD
V_GND
3

MEMORY DEVICE INCLUDING IN-MEMORY OPERATION CIRCUIT AND OPERATING METHOD THEREOF

CROSS-REFERENCE TO RELATED APPLICATIONS

This application is based on and claims priority under 35 U.S.C. § 119 to Korean Patent Application Nos. 10-2024-0002446, filed on Jan. 5, 2024, and 10-2024-0065356, filed on May 20, 2024, in the Korean Intellectual Property Office, the disclosure of each of which is incorporated by reference herein in its entirety.

BACKGROUND

The inventive concept relates to a memory device, and more particularly, to a memory device performing a compute-in-memory (CIM) function and an operating method thereof.

Artificial intelligence technology using artificial neural networks is achieving innovation by demonstrating outstanding accuracy in fields such as image recognition and natural language processing.

Because these artificial intelligence technologies require a huge amount of computations, CIM technology, which may perform some computations within memory, is attracting attention.

To implement CIM devices, various devices that may perform both memory and computational functions are being studied.

SUMMARY

The inventive concept provides a memory device that performs internal computational operations using an in-memory multiplier including a plurality of bit cells having different turn-on currents, and an operating method thereof.

According to an aspect of the inventive concept, there is provided a memory device including an in-memory operation circuit connected to a write word line, a plurality of write bit lines, a read word line, and a read bit line, and including a plurality of bit cells, wherein each of the plurality of bit cells includes a first transistor having one end connected to a corresponding a write bit line among the plurality of write bit lines, the other end connected to a storage node, and a gate terminal connected to the write word line, and at least one second transistor having one end connected to the read bit line, the other end connected to the read word line, and a gate terminal connected to the storage node. A current value of turn-on current of the at least one second transistor included in each of the plurality of bit cells corresponds to a value obtained by multiplying a reference current value by a power of 2 that is different for each of the plurality of bit cells.

According to another aspect of the inventive concept, there is provided a method of operating a memory device including a plurality of bit cells, each of which includes a first transistor and at least one second transistor, the first transistor having one end connected to a corresponding write bit line among a plurality of write bit lines, the other end connected to a storage node, and a gate terminal connected to a write word line; and the at least one second transistor having one end connected to a read bit line, the other end connected to a read word line, and a gate terminal connected to the storage node and providing a different turn-on current of each of the plurality of bit cells. The method includes performing a multiplication operation of first operation target data stored in the storage nodes of the plurality of bit cells, and second operation target data. The performing of the multiplication operation includes applying an off-voltage to the write word line in a first time period, applying a ground voltage to the read word line in a second time period, and applying a voltage having a magnitude associated with the second operation target data to a read bit line in a third time period.

According to another aspect of the inventive concept, there is provided a method of operating a memory device including a plurality of bit cells, each of which includes a first transistor and at least one second transistor, the first transistor having one end connected to a corresponding write bit line among a plurality of write bit lines, the other end connected to a storage node, and a gate terminal connected to a write word line; and the at least one second transistor having one end connected to a read bit line, the other end connected to a read word line, and a gate terminal connected to the storage node and providing a different turn-on current of each of the plurality of bit cells. The method includes performing a multiplication operation of first operation target data stored in the storage nodes of the plurality of bit cells, and second operation target data. The performing of the multiplication operation includes applying an off-voltage to the write word line in a first time period, applying a read bit line voltage to the read bit line in a second time period, and applying a pulse voltage to the read word line, the pulse voltage maintaining a level of a ground voltage for a pulse time period having a length proportional to a size of the second operation target data in a third time period.

BRIEF DESCRIPTION OF THE DRAWINGS

Embodiments of the inventive concept will be more clearly understood from the following detailed description taken in conjunction with the accompanying drawings in which:

FIG. 1 is a block diagram showing a semiconductor system according to an embodiment;

FIG. 4A and FIG. 4B are circuit diagrams illustrating structures of in-memory multipliers according to example embodiments;

FIG. 9 is a circuit diagram illustrating a refresh operation according to an embodiment;

FIG. 11 is a circuit diagram illustrating a multiplication operation according to an embodiment;

FIG. 13 is a circuit diagram illustrating a multiplication operation between binary number and decimal number according to an embodiment;

FIG. 14 is a circuit diagram illustrating a multiplication operation according to an embodiment;

DETAILED DESCRIPTION OF THE EMBODIMENTS

Figure 2A:
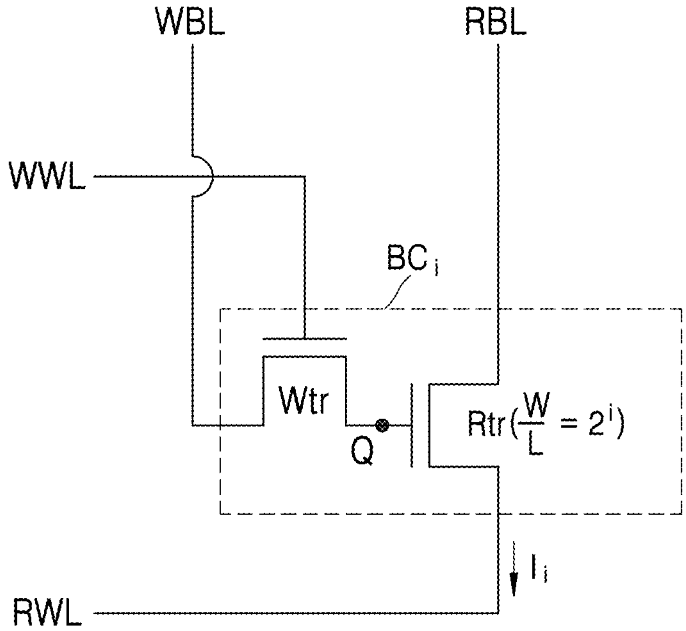
FIGS. 2A, 2B, 3A and 3B are circuit diagrams illustrating bit cells according to example embodiments.

Hereinafter, embodiments of the inventive concept are described in detail with reference to the attached drawings.

FIG. 1 is a block diagram showing a semiconductor system according to an embodiment.

Referring to FIG. 1, a semiconductor system 1 according to an embodiment may include a host device 10 and a memory device 20.

The host device 10 may be, for example, a computing system such as a computer, a laptop, a server, a workstation, a portable communication terminal, a personal digital assistant (PDA), a portable multimedia player (PMP), a smartphone, or a wearable device. Alternatively, the host device 10 may be one of the components included in a computing system, such as a graphics card.

The host device 10 is a functional block that operates as a general computer within the semiconductor system 1, and may include a central processing unit (CPU), a digital signal processor (DSP), a graphics processing unit (GPU), or an application processor (AP). The host device 10 may include a memory controller 11 that manages data transmission and reception to/from the memory device 20.

The memory controller 11 may access the memory device 20 in response to a memory request from the host device 10. For example, the memory controller 11 may access an in-memory multiplier (IMM) 21 included in the memory device 20 by providing addresses, commands, and data to the memory device 20. The memory controller 11 may control a write operation, a multiplication operation, a refresh operation, or a read operation for the IMM 21. In this specification, the IMM 21 may be referred to as an in-memory operation circuit.

In some embodiments, the memory controller 11 may access a memory cell array 22 included in the memory device 20 by providing addresses, commands, and data to the memory device 20.

The memory device 20 may write data or read data under the control by the memory controller 11. For example, the memory device 20 may be a double data rate synchronous dynamic random access memory (DDR SDRAM) device. However, the scope of the inventive concept is not limited thereto, and the memory device 20 may be any one of volatile memory devices such as low power double data rate (LPDDR) SDRAM, wide I/O DRAM, high bandwidth memory (HBM), hybrid memory cube (HMC), etc. Depending on an embodiment, the memory device 20 may be any one of nonvolatile memory devices such as flash memory, phase-change RAM (PRAM), magnetic RAM (MRAM), resistive RAM (RRAM), ferroelectric RAM (FRAM), etc.

The memory device 20 may be a compute-in-memory (CIM) device or a processing-in-memory (PIM) device that performs internal operations under the control by the host device 10.

The memory device 20 may include the IMM 21, the memory cell array 22, a voltage generator 23, an analog to digital converter (ADC) 24, a word line driver 25, and a bit line sense amplifier (BLSA) 26.

The IMM 21 may perform a write operation, the read operation, the refresh operation, or the multiplication operation on the target data. The IMM 21 may be connected to a write word line WWL, a plurality of write bit lines WBLs, a read word line RWL and a read bit line RBL. The IMM 21 may operate in a processing mode.

The memory cell array 22 may store data provided from the memory controller 11 or provide data requested by the memory controller 11. Although not shown, the memory cell array 22 may be connected to bit lines and word lines. The memory cell array 22 may operate in a normal mode.

The memory controller 11 may access the IMM 21 or the memory cell array 22 through an address. However, the invention is not limited thereto, and the IMM 21 may be included in a memory cell array 22, and a portion of the memory cell array 22 may operate as the IMM 21.

Each of the IMM 21 and the memory cell array 22 may include a plurality of memory cells. The IMM 21 and the memory cell array 22 may include 2-transistor, 0-capacitor (2T0C) cells or 2-transistor, 1-capacitor (2T1C) cells, but the invention is not limited thereto. The memory cells included in the IMM 21 may be referred to as bit cells. The multiplication operation may be performed on the data stored in the bit cell.

The voltage generator 23 may generate voltages applied to the write word line WWL, the write bit line WBL, the read word line RWL, and the read bit line RBL of the IMM 21.

The ADC 24 may detect the current value of the current output from the read word line RWL, and based on the detected current value, may obtain data stored in the IMM 21 or data corresponding to the result of the multiplication operation by the IMM 21.

During a write operation, the IMM 21 may store first operation target data in a plurality of bit cells included in the IMM 21 based on voltages provided from the plurality of write bit lines WBLs. For example, when a first write bit line voltage (e.g., $V_{WBL1}$ in FIG. 6) is applied to the write bit line WBL, '1' may be stored in the bit cell, and when a second write bit line voltage (e.g., $V_{WBL2}$ in FIG. 6) is applied to the write bit line WBL, '0' may be stored in the bit cell. The write operation may be described in detail below with reference to FIGS. 6 to 8.

A plurality of bit cells included in the IMM 21 may output a turn-on current depending on the first operation target data. In detail, each of the plurality of bit cells may be turned on or off depending on the first operation target data stored in each of the plurality of bit cells. For example, when a '1' is stored in the bit cell, the bit cell may be turned on, and when a '0' is stored in the bit cell, the bit cell may be turned off.

The current values of the turn-on currents output from the plurality of bit cells may be different. The current values of the turn-on currents output from the plurality of bit cells may correspond to the product of the reference current value and a power of 2. For example, the current value of the turn-on current output from the first bit cell may correspond to the product of the reference current value and $2^0=1$, the current value of the turn-on current output from the second bit cell may correspond to the product of the reference current value and $2^1$, the current value of the turn-on current output from the third bit cell may correspond to the product of the reference current value and $2^2$, and the current value of the turn-on current output from the fourth bit cell may correspond to the product of the reference current value and $2^3$. The reference current value may mean the current value of the turn-on current output from the first bit cell. Accordingly, the current value of the turn-on current output from a specific bit cell may represent the digit value of the digit corresponding to the bit cell among the binary number indicated by the first operation target data. For example, when the first to fourth bit cells store a four-digit binary number, the first bit cell stores the least significant bit (LSB), and the fourth bit cell stores the most significant bit (MSB), the current value of the turn-on current output from the first bit cell may represent $2^0$, and the current value of the turn-on current output from the fourth bit cell may represent $2^3$.

In some embodiments, a channel width-length ratio W/L ratio of read transistors (e.g., Rtr in FIGS. 2A and 2B) included in the plurality of bit cells may correspond to the product of the reference channel width-length ratio and a power of 2. For example, the channel width-length ratio of the read transistor included in the first bit cell may correspond to a value obtained by multiplying the reference channel width-length ratio by $2^0=1$, the channel width-length ratio of the read transistor included in the second bit cell may correspond to a value obtained by multiplying the reference channel width-length ratio by $2^1$, the channel width-length ratio of the read transistor included in the third bit cell may correspond to a value obtained by multiplying the reference channel width-length ratio by $2^2$, and the channel width-length ratio of the read transistor included in the fourth bit cell may correspond to a value obtained by multiplying the reference channel width-length ratio by $2^3$. The reference channel width-length ratio may mean the channel width-length ratio of a read transistor included in the first bit cell. The structure of a bit cell that performs internal computational operations based on the channel width-length ratio may be described with reference to FIGS. 2A and 3A.

In some embodiments, each of the plurality of bit cells may include a number of read transistors that are a power of 2 connected in parallel. The channel width-length ratio of the read transistors included in each of the plurality of bit cells may be the same. For example, the first bit cell may include $2^0=1$ read transistors, the second bit cell may include $2^1=2$ read transistors, the third bit cell may include $2^2=4$ read transistors, and the fourth bit cell may include $2^3=8$ read transistors. The structure of a bit cell that performs internal computational operations based on a number of read transistors corresponding to a power of 2 connected in parallel may be explained with reference to FIGS. 2B and 3B.

During a multiplication operation, the IMM 21 may perform a multiplication operation on the first operation target data and the second operation target data based on a voltage corresponding to the stored first operation target data and the second operation target data provided through the read bit line RBL or the read word line RWL via the voltage generator 23. In some embodiments, when the second operation target data is A, the voltage generator 23 may provide $A \times V_{READ}$ to the read bit line RBL, and the IMM 21 may output a current having a current value corresponding to the product of the reference current value, the first operation target data, and A through the read word line RWL. In some embodiments, when the second operation target data is A, the voltage generator 23 may provide a negative pulse voltage having an off voltage level for A time to the read word line RWL, and the IMM 21 may output a current having a current value corresponding to a value obtained by multiplying the reference current value, the first operation target data, and A through the read word line RWL. The multiplication operation may be described in detail below with reference to FIGS. 11 to 16.

The ADC 24 may detect current from the read word line RWL and obtain binary number data corresponding to the product of the first operation target data and A from the current value of the detected current. However, the operation of the ADC 24 is not limited to thereto. For example, the ADC 24 may obtain binary number data corresponding to the product of the first operation target data and A based on the reduced voltage level of the read bit line RBL while current is output through the read word line RWL after precharging the read bit line RBL. For example, the ADC 24 may include at least one capacitor and obtain binary number data corresponding to the product of the first operation target data and A by detecting a voltage of the capacitor. An example of the operation of the ADC 24 may be described below with reference to FIG. 5.

During a read operation, the IMM 21 may output the sum of turn-on currents output from the plurality of bit cells to the read word line RWL by selectively turning on the read transistors of the plurality of bit cells depending on the first operation target data. The ADC 24 may obtain first operation target data corresponding to the read result based on the sum of the turn-on currents. The read operation may be an example of a multiplication operation. In detail, the multiplication operation when the second operation target data is '1' may be understood as the read operation. The read operation may be described in detail below with reference to FIGS. 17 and 18.

During the refresh operation, the memory device 20 may maintain the first operation target data stored in a storage node of each of the plurality of bit cells. In detail, the memory device 20 may include a plurality of bit line sense amplifiers (e.g., $SA_0$ to $SA_{N-1}$ of FIG. 9) connected to a plurality of write bit lines WBLs, and may perform the refresh operation based on the plurality of bit line sense amplifiers. The refresh operation may be described in detail below with reference to FIGS. 9 and 10.

The word line driver 25 may apply the voltage generated from the voltage generator 23 to the write word line WWL or the read word line RWL.

The BLSA 26 may apply the voltage generated from the voltage generator 23 to the write bit line WBL or the read bit line RBL.

The memory device 20 according to an embodiment may perform the write operation, the read operation, the refresh operation, and the multiplication operation through an IMM 21, thereby reducing the computational burden of the host device 10.

Furthermore, even if the process of the host device 10 receiving the first operation target data from the memory device 20 is omitted, a multiplication operation for the first operation target data may be performed within the memory device 20, so a bottleneck phenomenon due to the operation data may be resolved.

FIGS. 2A, 2B, 3A and 3B are circuit diagrams illustrating bit cells $BC_i$ and $BC_i'$ according to example embodiments.

During a write operation, the IMM 21 of FIG. 1 may store the first operation target data. Referring to FIG. 2A, the bit corresponding to the ith digit of the first operation target data may be stored in a storage node Q of the bit cell $BC_i$.

The bit cell $BC_i$ may include a write transistor Wtr and a read transistor Rtr. For example, the bit cell $BC_i$ may have a 2T0C structure. At least one of the write transistor Wtr and the read transistor Rtr may include a channel including InGaZnO (IGZO) oxide. However, the invention is not limited thereto, and the channels of the write transistor Wtr and the read transistor Rtr may include various materials. One end of the write transistor Wtr may be connected to the write bit line WBL, the other end of the write transistor Wtr may be connected to the storage node Q, and the gate terminal of the write transistor Wtr may be connected to the write word line WWL.

One end of the read transistor Rtr may be connected to the read bit line RBL, the other end of the read transistor Rtr may be connected to the read word line RWL, and the gate terminal of the read transistor Rtr may be connected to the storage node Q.

During the write operation, the bit corresponding to the ith digit of the first operation target data may be stored in the storage node Q. When the first operation target data includes N bits (N is a natural number), the bit corresponding to the 0th digit may be the LSB, and the bit corresponding to the (N−1)th digit may be the MSB.

During a read operation, the bit cell $BC_i$ may provide a turn-on current Ii having a current value corresponding to a product value between the digit value of the ith digit of the first operation target data and the reference current value to the read word line RWL.

During a multiplication operation, second operation target data may be provided through a read bit line RBL or a read word line RWL. During the multiplication operation, the bit cell $BC_i$ may provide a turn-on current $I_i$ having a current value corresponding to a product of a digit value of the ith digit among the first operation target data, the reference current value, and the second operation target data to the read word line RWL. For example, when '1' is stored in the storage node Q and the second operation data having the value A is provided through the read bit line RBL or the read word line RWL, the read transistor Rtr may output a turn-on current having a current value corresponding to the product of $2^i$, the reference current value, and A to the read word line RWL.

While a turn-on voltage is applied to the write word line WWL, a first write bit line voltage (e.g., $V_{WBL1}$ in FIG. 6) or a second write bit line voltage (e.g., $V_{WBL2}$ in FIG. 6) is applied to the write bit line WBL, so that '1' or '0' may be stored in the storage node Q.

In FIG. 2A, the channel width-length ratio W/L ratio of the read transistor Rtr may correspond to $2^i$. In detail, the channel width-length ratio W/L ratio of the read transistor Rtr may correspond to the product of the reference channel width-length ratio and $2^i$.

Figure 2B:
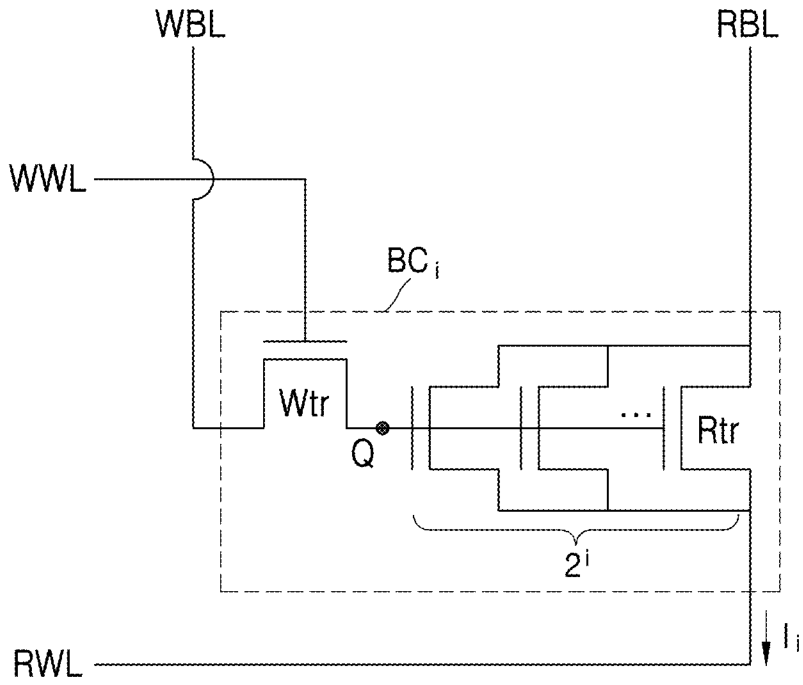

In FIG. 2B, unlike the bit cell $BC_i$ of FIG. 2A, the bit cell $BC_i$ may include $2^i$ read transistors Rtr.

In FIG. 2B, one end of each of the $2^i$ read transistors Rtr may be commonly connected to the read bit line RBL, the other end of each of the $2^i$ read transistors Rtr may be commonly connected to the read word line RWL, and the gate terminals of the $2^i$ read transistors Rtr may be commonly connected to the storage node Q. For example, in FIG. 2B, $2^i$ read transistors Rtr may be connected in parallel between the read bit line RBL and the read word line RWL.

In FIG. 2B, the channel width-length ratio of each of the $2^i$ read transistors Rtr may be the same as each other. Therefore, the current value of turn-on current of each of the $2^i$ read transistors Rtr may be the same as each other. During the read operation, the sum of the current values of the turn-on currents provided from the $2^i$ read transistors Rtr to the read word line RWL may correspond to the value obtained by multiplying the reference current value by $2^i$. During the multiplication operation, the sum of the current values of the turn-on currents provided from the $2^i$ read transistors Rtr to the read word line RWL may correspond to a value obtained by multiplying the reference current value, $2^i$, and the second operation target data.

In FIGS. 2A and 2B, during the multiplication operation, the bit cell $BC_i$ may provide a current having a current value corresponding to the product of the reference current, $2^i$, and the second operation target data to the read word line RWL.

In FIGS. 2A and 2B, during the read operation, the bit cell $BC_i$ may provide a current having a current value corresponding to a product of $2^i$, which is the position value of the bit located at the ith position of the first operation target data, and the reference current value, to the read word line RWL.

Figure 3A:
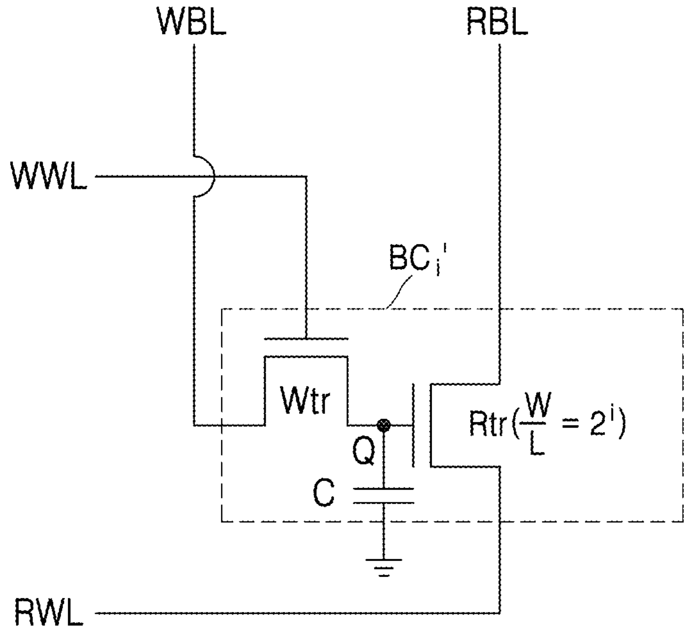
Figure 3B:
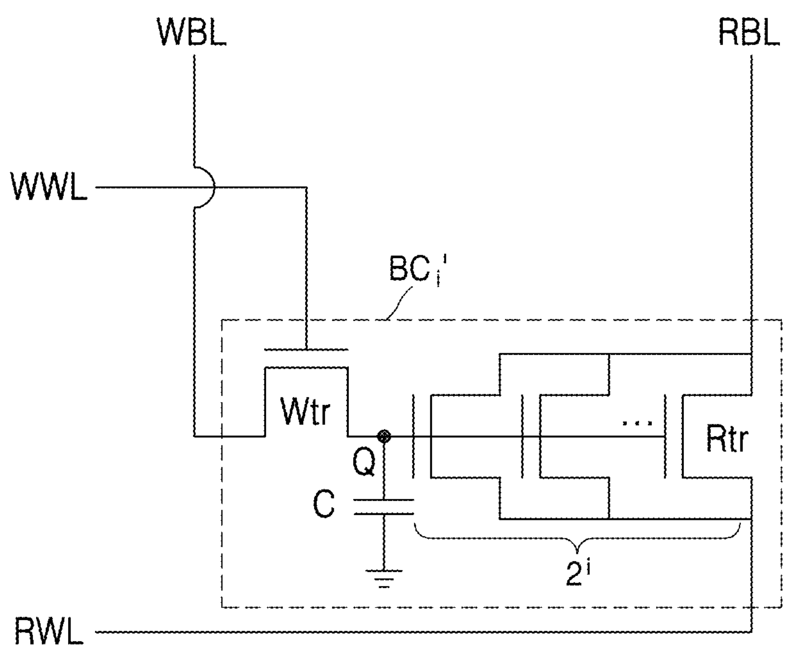

Referring to FIGS. 3A and 3B, unlike the bit cell $BC_i$ of FIG. 2, the bit cell $BC_i'$ may further include a capacitor C. One end of the capacitor C may be connected to a storage node Q, and the other end of the capacitor C may be connected to a ground node. By connecting the capacitor C to the storage node Q, the amount of charge stored in the storage node Q may increase.

In this specification, the bit cell included in the IMM 21 is described as the bit cell $BC_i$ of FIG. 2A or FIG. 2B, but the invention is not limited thereto. For example, the bit cell included in the IMM 21 may be the bit cell BCi' of FIG. 3A or FIG. 3B, and may have various structures including the write transistor Wtr and the read transistor Rtr of the bit cell $BC_i$ of FIG. 2A and FIG. 2B.

Figure 4A:
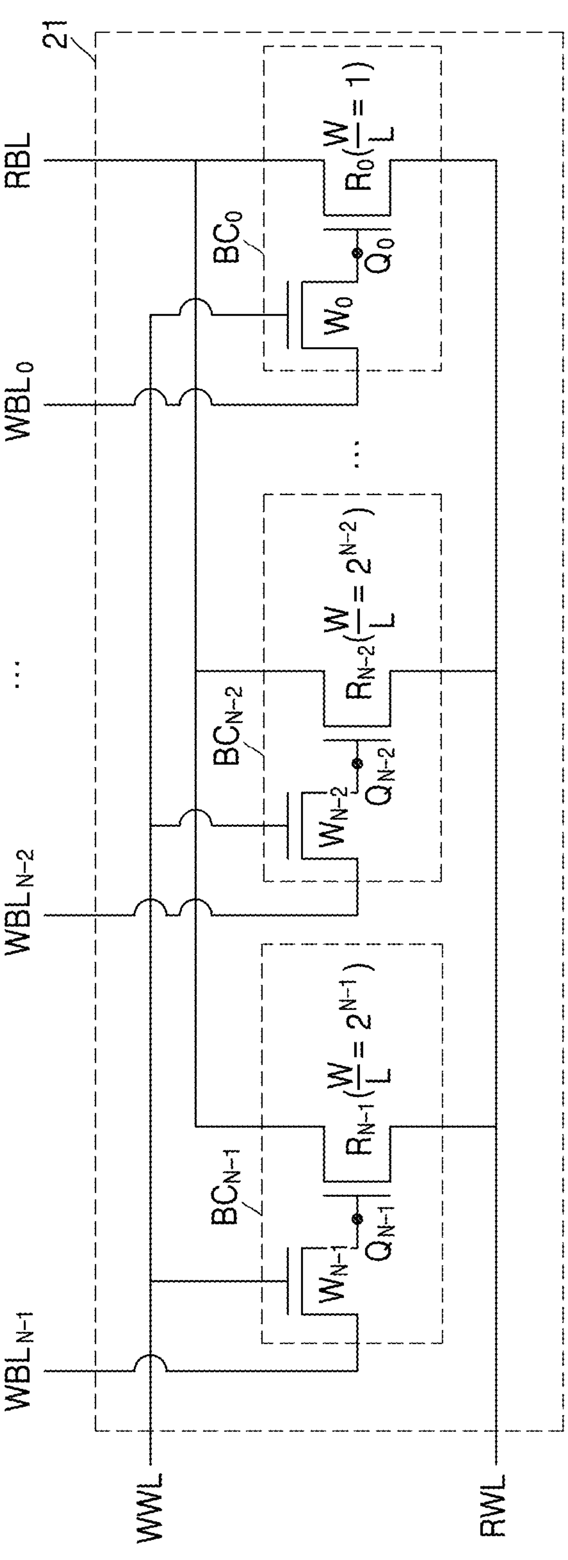
Figure 4B:
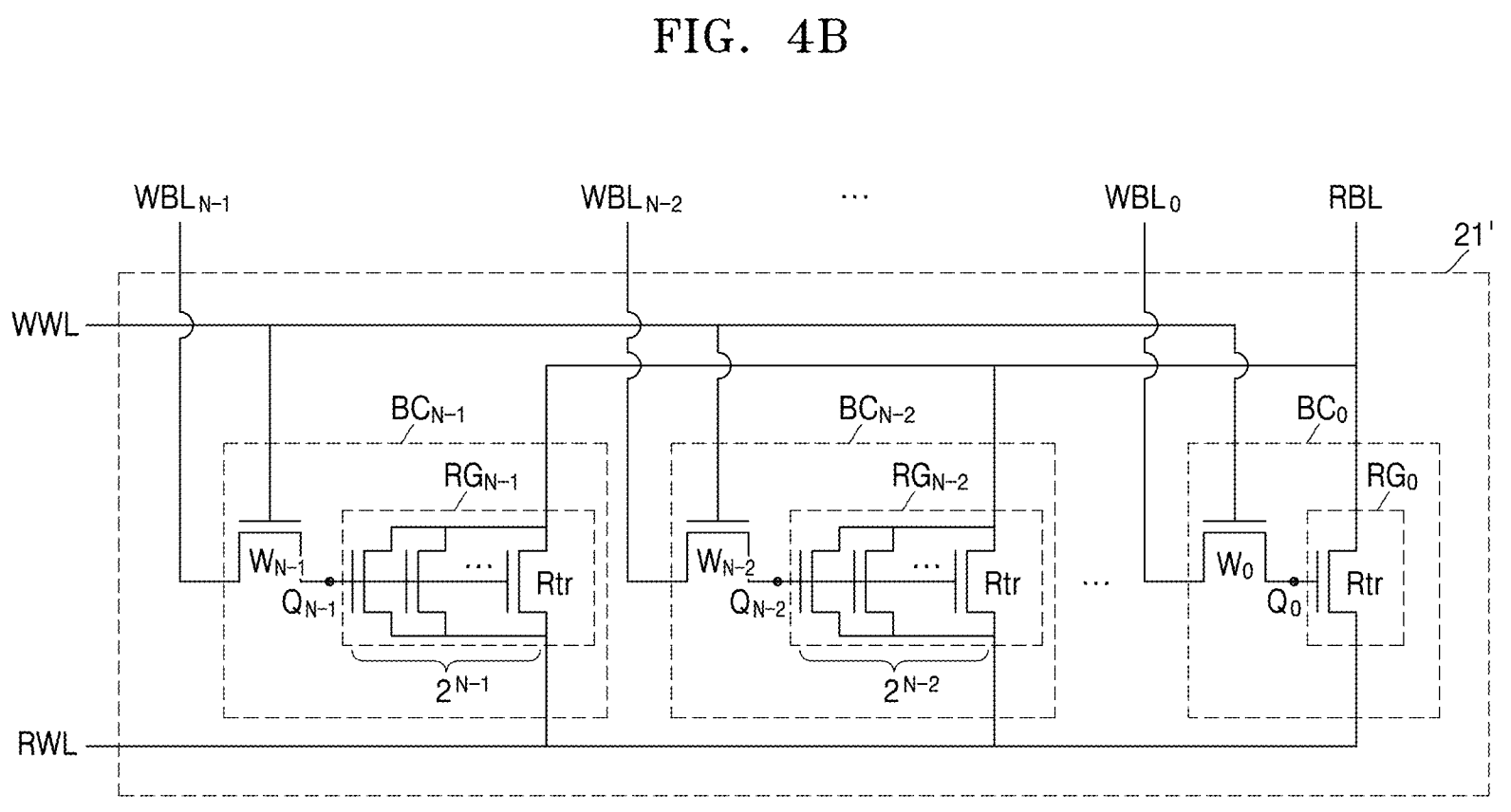

FIG. 4A and FIG. 4B are circuit diagrams illustrating structures of an IMM 21 and an IMM 21' according to example embodiments.

Referring to FIG. 4A, the IMM 21 may include first to N-bit cells $BC_0$ to $BC_{N-1}$.

The gate terminals of write transistors $W_0$ to $W_{N-1}$ included in the first to Nth bit cells $BC_0$ to $BC_{N-1}$ may be commonly connected to a write word line WWL. One end of each of the write transistors $W_0$ to $W_{N-1}$ may be connected to a corresponding write bit line of write bit lines $WBL_0$ to $WBL_{N=1}$. For example, one end of a write transistor $W_0$ may be connected to a write bit line $WBL_0$, one end of a write transistor $W_{N-2}$ may be connected to a write bit line $WBL_{N-2}$, and one end of a write transistor $W_{N-1}$ may be connected to a write bit line $WBL_{N-1}$. The other terminal of each of the write transistors $W_0$ to $W_{N-1}$ may be connected to a corresponding storage node. For example, the other end of the write transistor $W_0$ may be connected to a storage node $Q_0$, the other end of the write transistor $W_{N-2}$ may be connected to a storage node $Q_{N-2}$, and the other end of the write transistor $W_{N-1}$ may be connected to a storage node $Q_{N-1}$.

One end of read transistors $R_0$ to $R_{N-1}$ included in the first to Nth bit cells $BC_0$ to $BC_{N-1}$ may be commonly connected to a read bit line RBL. The other terminals of the read transistors $R_0$ to $R_{N-1}$ may be commonly connected to a read word line RWL. The gate terminal of each of the read transistors $R_0$ to $R_{N-1}$ may be connected to a corresponding storage node. For example, a gate terminal of a read transistor $R_0$ may be connected to the storage node $Q_0$, a gate terminal of a read transistor $R_{N-2}$ may be connected to the storage node $Q_{N-2}$, and a gate terminal of a read transistor $R_{N-1}$ may be connected to the storage node $Q_{N-1}$.

The channel width-length ratio W/L of each of the read transistors $R_0$ to $R_{N-1}$ may correspond to the product of a reference channel width-length ratio and a power of 2. For example, the channel width-length ratio of the read transistor $R_0$ may be a product of the reference channel width-length ratio and $2^0=1$, the channel width-length ratio of the read transistor $R_{N-2}$ may be a product of the reference channel width-length ratio and $2^{N-2}$, and the channel width-length ratio of the read transistor $R_{N-1}$ may be a product of the reference channel width-length ratio and $2^{N-1}$. The reference channel width-length ratio may refer to the channel width-length ratio of the read transistor $R_0$.

During the write operation, first operation target data may be stored in storage nodes $Q_0$ to $Q_{N-1}$ of first to N-bit cells $BC_0$ to $BC_{N-1}$ based on voltages provided through write bit lines $WBL_0$ to $WBL_{N=1}$. For example, when the first write bit line voltage $V_{WBL1}$ is applied to the write bit line $WBL_0$, '1' may be stored in the storage node $Q_0$, and when the second write bit line voltage $V_{WBL2}$ is applied to the first write bit line $WBL_0$, '0' may be stored in the storage node $Q_0$. For example, the first write bit line voltage $V_{WBL1}$ may be a positive power supply voltage VDD, and the second write bit line voltage $V_{WBL2}$ may be a ground voltage $V_{GND}$.

During a read operation, each of the read transistors $R_0$ to $R_{N-1}$ may output a turn-on current having a magnitude proportional to the corresponding channel width-length ratio to the read word line RWL. For example, each of the read transistors $R_0$ to $R_{N-1}$ may provide a turn-on current having a current value corresponding to a product of a digit value of a corresponding digit and a reference current value to the read word line RWL. Therefore, the total current for the turn-on currents provided to the read word line RWL may have a current value corresponding to the product of the first operation target data and the reference current value.

During a multiplication operation, each of the read transistors $R_0$ to $R_{N-1}$ may output a turn-on current having a magnitude proportional to the corresponding channel width-length ratio and the second operation target data to the read word line RWL. For example, each of the read transistors $R_0$ to $R_{N-1}$ may provide a turn-on current having a current value corresponding to a multiplication value between a digit value of a corresponding digit, a reference current value, and second operation target data to the read word line RWL. Therefore, the total current for the turn-on currents provided to the read word line RWL may have a current value corresponding to a product of the first operation target data, the reference current value, and the second operation target data.

The ADC 24 may obtain first operation target data corresponding to the result of the read operation or binary number data corresponding to the result of the multiplication operation based on the total current.

The memory device 20 according to an embodiment may operate as a CIM by performing the multiplication operation using bit cells of which the ratio between turn-on currents is a power of 2.

Referring to FIG. 4B, the IMM 21' may include first to N-bit cells $BC_0$ to $BC_{N-1}$.

Each of the first to N-bit cells $BC_0$ to $BC_{N-1}$ may include a number of read transistors Rtr corresponding to a power of 2. Additionally, each of the first to N-bit cells $BC_0$ to $BC_{N-1}$ may include different numbers of read transistors Rtr. The number of read transistors Rtr may be equal to the digit value of the corresponding digit to the first to Nth bit cells $BC_0$ to $BC_{N-1}$. For example, the first bit cell $BC_0$ may include $2^0=1$ read transistor Rtr which is the digit value of the 0th digit, the (N−1)th bit cell $BC_{N-2}$ may include $2^{N-2}$ read transistors Rtr which are the digit value of the (N−2)th digit, and the Nth bit cell $BC_{N-1}$ may include $2^{N-1}$ read transistors Rtr which are the digit value of the (N−1)th digit.

In each of the first to Nth bit cells $BC_0$ to $BC_{N-1}$, one terminal of the read transistors Rtr may be commonly connected to the read bit line RBL, and the other terminals of the read transistors Rtr may be commonly connected to the read word line RWL, and the gate terminals of the read transistors Rtr may be commonly connected to the storage node.

A set of read transistors Rtr included in each of the first to Nth bit cells $BC_0$ to $BC_{N-1}$ may be referred to as a read transistor group. For example, one read transistor included in the first bit cell $BC_0$ may be referred to as a first read transistor group $RG_0$, $2^{N-2}$ read transistors Rtr included in the N−1 bit cell $BC_{N-2}$ may be referred to as an N−1 read transistor group $RG_{N-2}$, and $2^{N-1}$ read transistors Rtr included in the N-th bit cell $BC_{N-1}$ may be referred to as an N-th read transistor group $RG_{N-1}$.

During the read operation, each of the first to Nth read transistor groups $RG_0$ to $RG_{N-1}$ may output a turn-on current having a current value proportional to the number of read transistors included in each of the first to Nth read transistor groups $RG_0$ to $RG_{N-1}$ to the read word line RWL. For example, each of the first to Nth read transistor groups $RG_0$ to $RG_{N-1}$ may provide a turn-on current having a current value corresponding to a product of the digit value of the corresponding digit and a reference current value to the read word line RWL. Therefore, the total current for the turn-on currents provided to the read word line RWL may have a current value corresponding to the product value between the first operation target data and the reference current value.

During a multiplication operation, each of the first to Nth read transistor groups $RG_0$ to $RG_{N-1}$ may output a turn-on current having a magnitude proportional to the number of read transistors included in each of the first to Nth read transistor groups $RG_0$ to $RG_{N-1}$ and the second operation target data to the read word line RWL. For example, each of the first to Nth read transistor groups $RG_0$ to $RG_{N-1}$ may provide a turn-on current having a current value corresponding to a product of a digit value of a corresponding digit, a reference current value, and second operation target data to the read word line RWL. Therefore, the total current for the turn-on currents provided to the read word line RWL may have a current value corresponding to a product of the first operation target data, the reference current value, and the second operation target data.

Hereinafter, the description is made with focus on the IMM 21 of FIG. 4A, but the description of the IMM 21 of FIG. 4A may also be applied to the IMM 21' of FIG. 4B. For example, among the read transistors $R_0$ to $R_{N-1}$ in FIG. 4A, the turn-on current provided by a read transistor $R_i$ to the read word line RWL may be the same as the turn-on current provided from a read transistor group $RG_i$ among the read transistor groups $RG_0$ to $RG_{N-1}$ in FIG. 4B to the read word line RWL.

Figure 5:
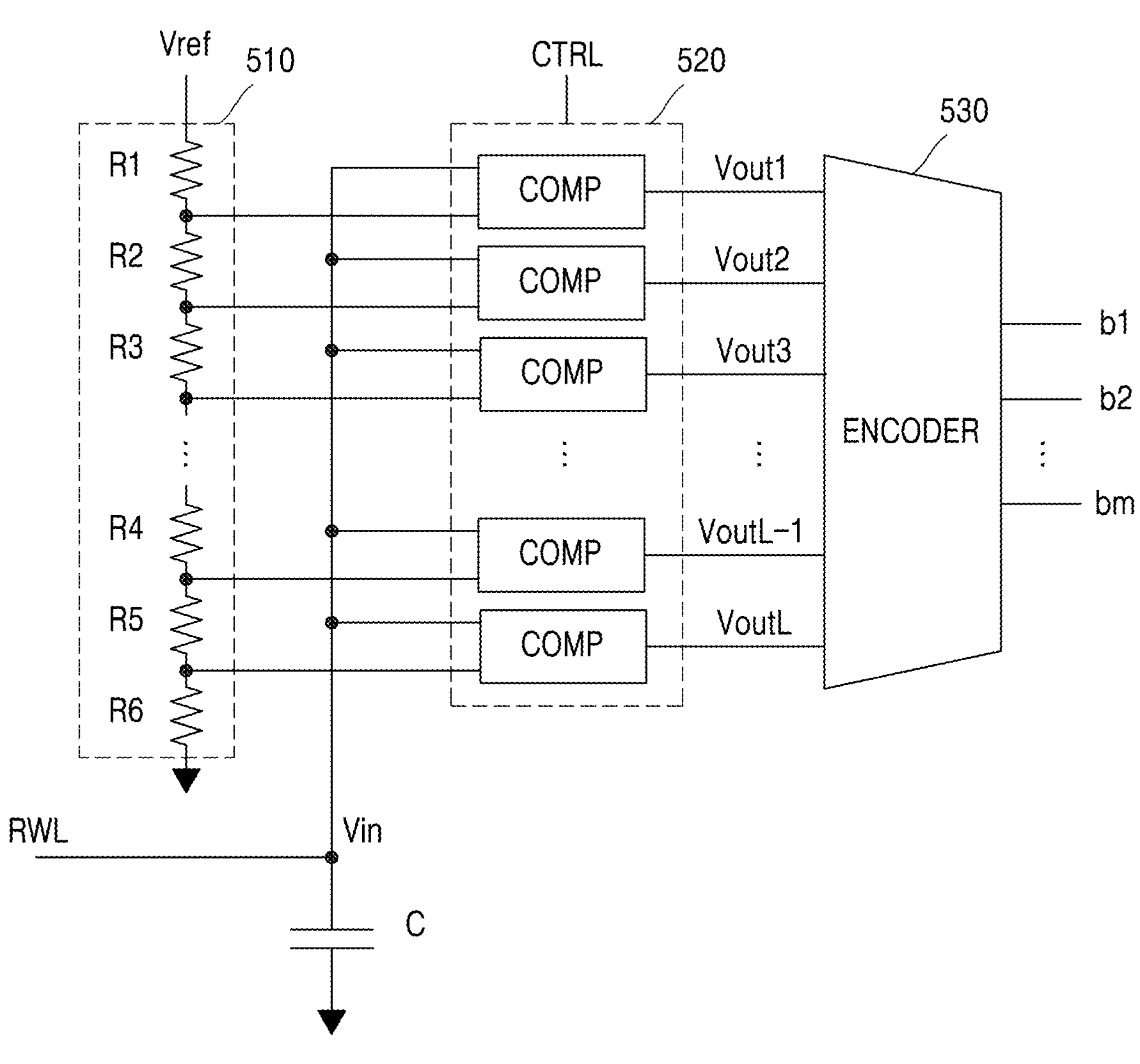
FIG. 5 is a circuit illustrating an analog to digital converter according to an embodiment.

FIG. 5 is a circuit illustrating an ADC 24 according to an embodiment.

Referring to FIG. 5, the ADC 24 may convert an analog input signal Vin into a digital output signal b1 to bm. The analog input signal Vin may be the voltage charged to a capacitor C. The capacitor C may be charged by a current provided from a read word line RWL of the IMM 21, and the voltage charged during a reference time may be applied to a comparator circuit 520 as an analog input signal Vin.

The digital output signal b1 to bm may be composed of a plurality of bits. During a read operation, the binary number indicated by the digital output signal b1 to bm may be the first operation target data stored in the IMM 21. During a multiplication operation, the binary number indicated by the digital output signals b1 to bm may be the result of multiplying the first operation target data stored in the IMM 21 and the second operation target data corresponding to the voltage applied to the read bit line RBL.

The ADC 24 may include a resistor array 510, the comparator circuit 520, and an encoder 530. The comparator circuit 520 may include a plurality of comparators COMP.

The resistor array 510 may include a plurality of resistors R1 to R6. One end of the resistor array 510 may receive a reference voltage Vref, and the other end of the resistor array 510 may be connected to a ground node. The reference voltage Vref may be distributed to each node formed by the plurality of resistors R1 to R6.

The comparator circuit 520 may output multiple output signals Vout1 to VoutL by comparing a voltage signal distributed to each node formed by the plurality of resistors R1 to R6 with the analog input signal Vin and amplifying the comparison result.

The encoder 530 may receive the plurality of output signals Vout1 to VoutL and generate bit sequences corresponding to the plurality of output signals Vout1 to VoutL as the digital output signal b1 to bm.

The ADC 24 may be implemented in various ways, unlike FIG. 5, and may have various structures that generate binary number data corresponding to the current value of the current based on the current provided from the read word line RWL.

Figure 6:
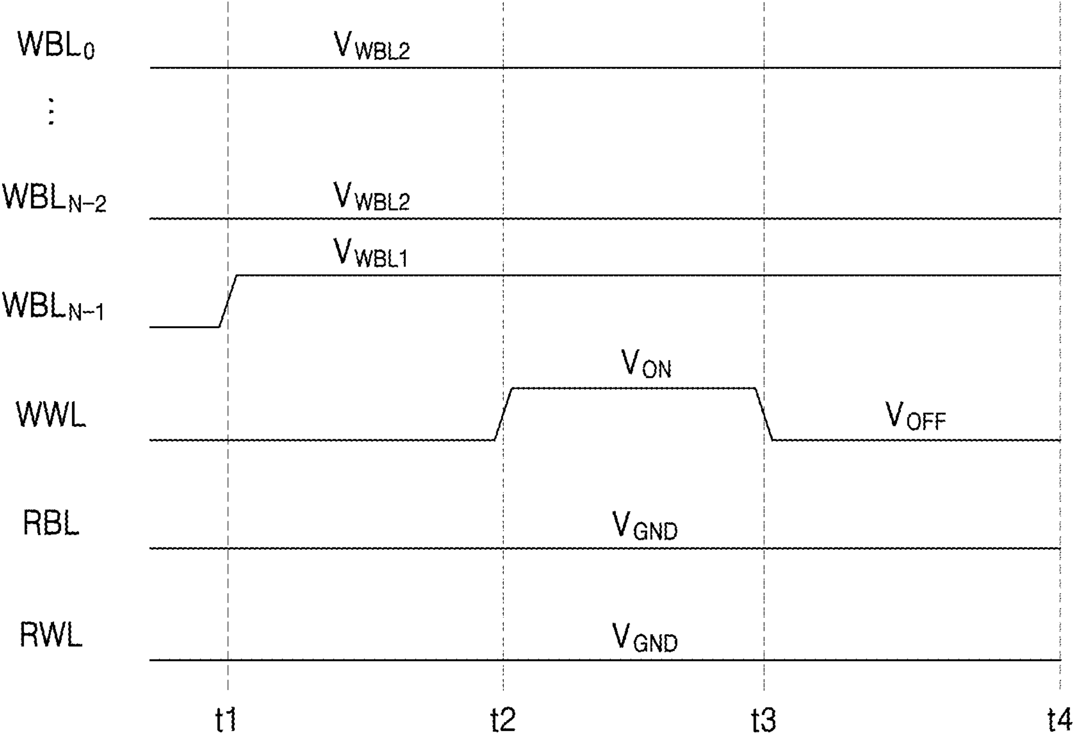
FIGS. 6 and 7 are timing diagrams illustrating a write operation according to example embodiments.
Figure 7:
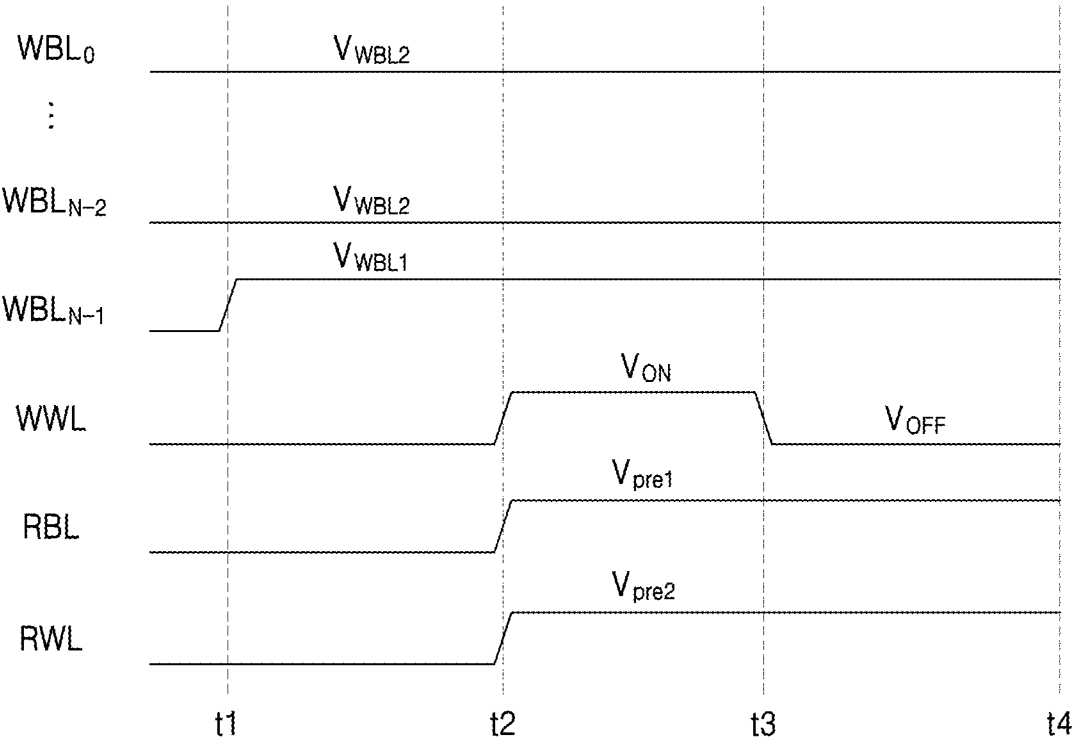

FIGS. 6 and 7 are timing diagrams illustrating a write operation according to example embodiments. FIGS. 6 and 7 may be explained with reference to FIGS. 1 and 4A.

Referring to FIG. 6, at a first time point t1, the BLSA 26 may apply a second write bit line voltage $V_{WBL2}$ to the write bit lines $WBL_0$ to $WBL_{N-2}$ and apply a first write bit line voltage $V_{WBL1}$ to the write bit line $WBL_{N-1}$. Accordingly, one end of each of the first to Nth write transistors $W_0$ to $W_{N-1}$ may be precharged with the first write bit line voltage $V_{WBL1}$ or the second write bit line voltage $V_{WBL2}$. The level of the first write bit line voltage $V_{WBL1}$ may be higher than the level of the second write bit line voltage $V_{WBL2}$.

Referring to FIG. 6, at a second time point t2, the word line driver 25 may apply an on-voltage $V_{ON}$ to the write word line WWL. The first to Nth write transistors $W_0$ to $W_{N-1}$ may be turned on by the on-voltage $V_{ON}$. In an embodiment, a level of the on-voltage $V_{ON}$ may be identical to or greater than a level of the positive supply voltage VDD. The first write bit line voltage $V_{WBL1}$ or the second write bit line voltage $V_{WBL2}$ precharged to one end of each of the first to N write transistors $W_0$ to $W_{N-1}$ may be transmitted to the other end of each of the first to N write transistors $W_0$ to $W_{N-1}$. That is, the first operation target data may be transmitted to the first to N storage nodes $Q_0$ to $Q_{N-1}$.

Referring to FIG. 6, at the third time point t3, the word line driver 25 may apply an off-voltage $V_{OFF}$ to the write word line WWL. The first to Nth write transistors $W_0$ to $W_{N-1}$ may be turned off by the off-voltage $V_{OFF}$. For example, the off-voltage $V_{OFF}$ may be the ground voltage $V_{GND}$. Accordingly, the first operation target data may be stored in the IMM 21 by maintaining the charge states of the first to N storage nodes $Q_0$ to $Q_{N-1}$.

In detail, '1' may be stored in the Nth storage node $Q_{N-1}$ precharged by the first write bit line voltage $V_{WBL1}$, and '0' may be stored in the first to (N−1)th storage nodes $Q_0$ to $Q_{N-2}$ precharged by the second write bit line voltage $V_{WBL2}$. That is, binary number data $10 \ldots 0_2$ may be stored in the IMM 21. However, the invention is not limited thereto, and 'O' may be stored in the Nth storage node $Q_{N-1}$ precharged by the first write bit line voltage $V_{WBL1}$, and '1' may also be stored in the first to (N−1)th storage nodes $Q_0$ to $Q_{N-2}$ precharged by the second write bit line voltage $V_{WBL2}$.

In FIG. 6, although the level of the on-voltage $V_{ON}$ is shown to be higher than the level of the off-voltage $V_{OFF}$, the invention is not limited thereto. For example, unlike the write transistors $W_0$ to $W_{N-1}$ illustrated as N-type transistors in FIG. 4A, when the write transistors are P-type transistors, the level of the on-voltage $V_{ON}$ may be lower than the level of the off-voltage $V_{OFF}$.

Referring to FIG. 6, during a time period from the first time point t1 to a fourth time point t4, the BLSA 26 may apply the ground voltage $V_{GND}$ to the read bit line RBL. The word line driver 25 may apply a ground voltage $V_{GND}$ to the read word line RWL.

In some embodiments, during a time period between the third time point t3 and the fourth time point t4, the BLSA 26 may initialize the write bit lines $WBL_0$ to $WBL_{N-1}$. For example, the BLSA 26 may apply the ground voltage $V_{GND}$ or the second write bit line voltage $V_{WBL2}$ to all of the write bit lines $WBL_0$ to $WBL_{N-1}$.

Referring to FIG. 7, unlike FIG. 6, during the time period from the first time point t1 to the fourth time point t4, the BLSA 26 may apply a first precharge voltage $V_{pre1}$ to the read bit line RBL. The word line driver 25 may apply a second precharge voltage $V_{pre2}$ to the read word line RWL. The first precharge voltage $V_{pre1}$ and the second precharge voltage $V_{pre2}$ may be the same or different. Each of the first precharge voltage $V_{pre1}$ and the second precharge voltage $V_{pre2}$ may have a level higher than the ground voltage $V_{GND}$.

By precharging both ends of the read transistors $R_0$ to $R_{N-1}$ while the first operation target data is stored in the storage nodes $Q_0$ to $Q_{N-1}$, current leaking from the storage nodes $Q_0$ to $Q_{N-1}$ to both ends of the read transistors $R_0$ to $R_{N-1}$ may be prevented.

However, the invention is not limited thereto, and the word line driver 25 and the BLSA 26 may prevent current from leaking in the storage nodes $Q_0$ to $Q_{N-1}$ to both ends of the read transistors $R_0$ to $R_{N-1}$ by precharging at least one of the read word line RWL and the read bit line RBL during a portion of the time period from the first time point t1 to the fourth time point t4.

Figure 8:
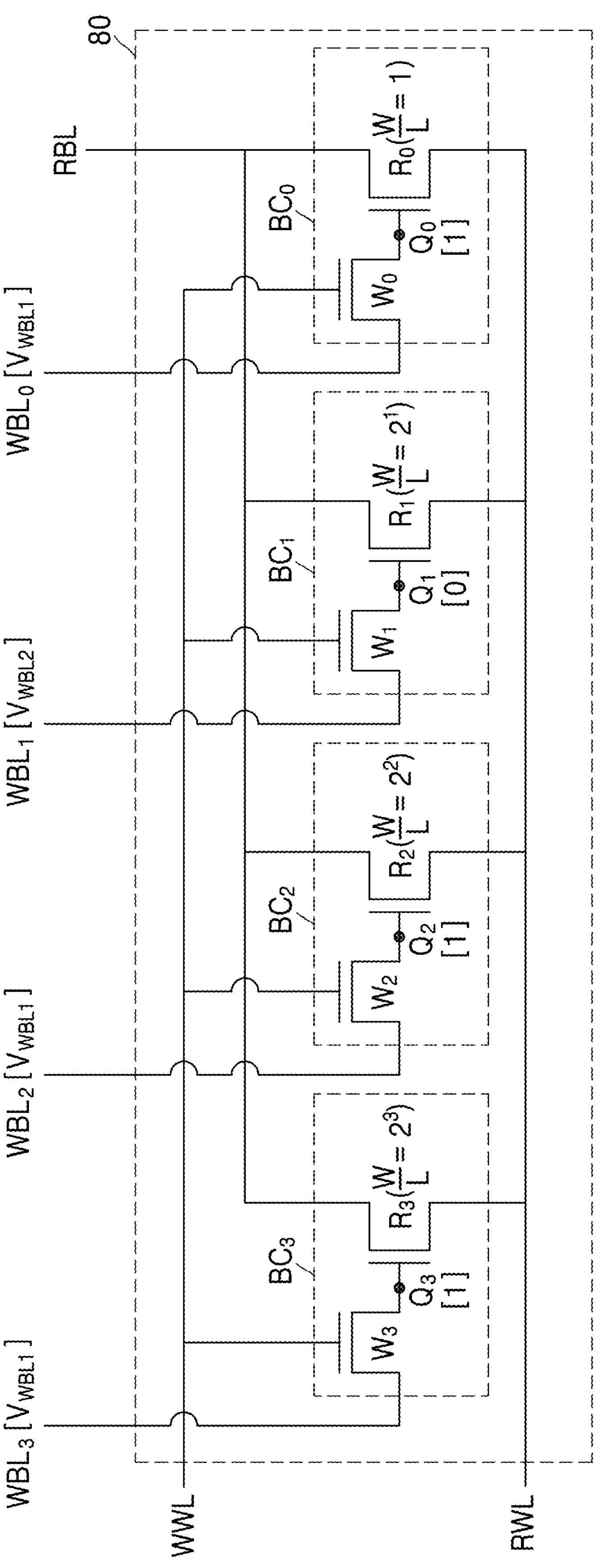
FIG. 8 is a diagram explaining a write operation for first operation target data according to an embodiment.

FIG. 8 is a diagram explaining a write operation for first operation target data $\mathbf{1101}_2$ according to an embodiment.

Referring to FIG. 8, an IMM 80 may have the structure and function of the IMM 21 described with reference to FIGS. 1, 2A, 2B, 3A, 3B, 4A, 4B, and 5 to 7. The IMM 80 may include first to fourth bit cells $BC_0$ to $BC_3$.

The IMM 80 may store the binary number $\mathbf{1101}_2$, which is the first operation target data, by performing a write operation.

The fourth bit cell $BC_3$ may store a bit corresponding to a digit having a digit value of $2^3$, i.e., the MSB, the third bit cell $BC_2$ may store a bit corresponding to a digit having a digit value of $2^2$, the second bit cell $BC_1$ may store a bit corresponding to a digit having a digit value of $2^1$, and the first bit cell $BC_0$ may store a bit corresponding to a digit having a digit value of $2^0$, i.e., the LSB.

In detail, as described with reference to FIGS. 6 and 7, at the first time point t1, the BLSA 26 may apply the first write bit line voltage $V_{WBL1}$ to the first, third, and fourth write bit lines $WBL_0$, $WBL_2$, and $WBL_3$, and the second write bit line voltage $V_{WBL2}$ may be applied to the second write bit line $WBL_1$.

The word line driver 25 may apply an on-voltage $V_{ON}$ to the write word line WWL at the second time point t2 and may apply an off-voltage $V_{OFF}$ to the write word line WWL at the third time point t3. Accordingly, the binary number $\mathbf{1101}_2$, which is the first operation target data, may be stored in the IMM 80.

Figure 10:
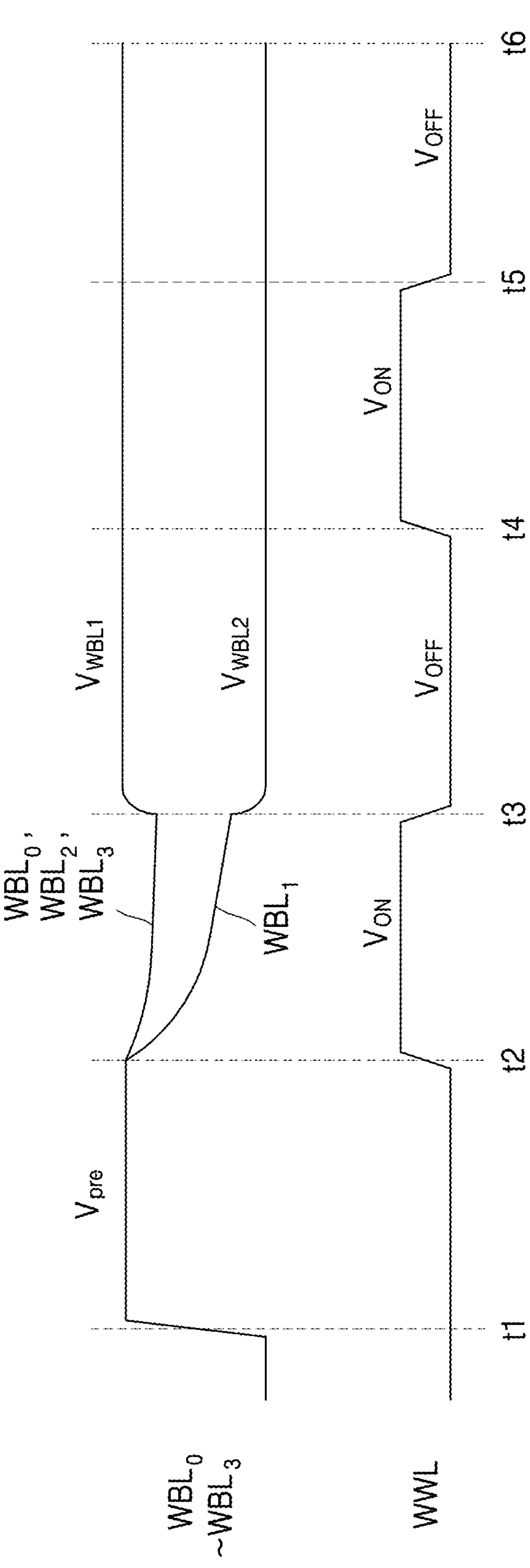
FIG. 10 is a timing diagram of the refresh operation of FIG. 9 according to an embodiment.

FIG. 9 is a circuit diagram illustrating a refresh operation according to an embodiment, and FIG. 10 is a timing diagram of the refresh operation of FIG. 9 according to an embodiment.

Referring to FIG. 9, as described above with reference to FIG. 8, the IMM 80 may store the first operation target data, $\mathbf{1101}_2$.

The write bit lines $WBL_0$ to $WBL_{N-1}$ may be connected to the BLSA 26. In detail, the write bit line $WBL_0$ may be connected to a sense amplifier $SA_0$, the write bit line $WBL_1$ may be connected to a sense amplifier $SA_1$, the write bit line $WBL_2$ may be connected to a sense amplifier $SA_2$, and the write bit line $WBL_3$ may be connected to a sense amplifier $SA_3$. The BLSA 26 may precharge the write bit lines $WBL_0$ to $WBL_{N-1}$ or sense the voltage level of each of the write bit lines $WBL_0$ to $WBL_{N-1}$.

Referring to FIG. 10, the refresh operation may be performed during a time period from a first time point t1 to a sixth time point t6.

At the first time point t1, the BLSA 26 may apply a precharge voltage Vpre to the write bit lines $WBL_0$ to $WBL_3$.

At a second time point t2, the word line driver 25 may apply an on-voltage $V_{ON}$ to the write word line WWL. Accordingly, the write transistors $W_0$ to $W_3$ may be turned on, and the storage nodes $Q_0$ to $Q_3$ may share charge with the write bit lines $WBL_0$ to $WBL_3$. Because the write bit line $WBL_1$ is connected to the storage node $Q_1$ where '0' is stored, the voltage level may decrease more significantly compared to the write bit lines $WBL_0$, $WBL_2$, and $WBL_3$ connected to the storage nodes $Q_0$, $Q_2$, and $Q_3$ where '1' is stored.

At a third time point t3, the word line driver 25 may turn off the write transistors $W_0$ to $W_3$ by applying an off-voltage $V_{OFF}$ to the write word line WWL.

At the third time point t3, the BLSA 26 may detect the voltage level of each of the write bit lines $WBL_0$ to $WBL_3$ and amplify the voltage level of each of the write bit lines $WBL_0$ to $WBL_3$ to a first write bit line voltage $V_{WBL1}$ or a second write bit line voltage $V_{WBL2}$. In detail, the voltage level of the write bit line $WBL_1$ having a relatively lower voltage level may be amplified to the second write bit line voltage $V_{WBL2}$, and the voltage level of each of the write bit lines $WBL_0$, $WBL_2$, and $WBL_3$ having a relatively higher voltage level may be amplified to the first write bit line voltage $V_{WBL1}$.

At a fourth time point t4, the word line driver 25 may apply an on-voltage $V_{ON}$ to the write word line WWL. The write transistors $W_0$ to $W_3$ may be turned on by the on-voltage $V_{ON}$. Accordingly, the first write bit line voltage $V_{WBL1}$ or the second write bit line voltage $V_{WBL2}$ may be provided to the storage nodes $Q_0$ to $Q_3$. In detail, the first write bit line voltage $V_{WBL1}$ may be provided to storage nodes $Q_0$, $Q_2$, and $Q_3$, and a second write bit line voltage $V_{WBL2}$ may be provided to the storage node $Q_1$.

At a fifth time point t5, the word line driver 25 may apply an off-voltage $V_{OFF}$ to the write word line WWL. The write transistors $W_0$ to $W_3$ may be turned off by the off-voltage $V_{OFF}$. Accordingly, the first operation target data may be stored in the IMM 80 by maintaining the charge state of the storage nodes $Q_0$ to $Q_3$.

Data retention performance may be improved by rewriting data to storage nodes $Q_0$ to $Q_3$ through the refresh operation.

Figure 11:
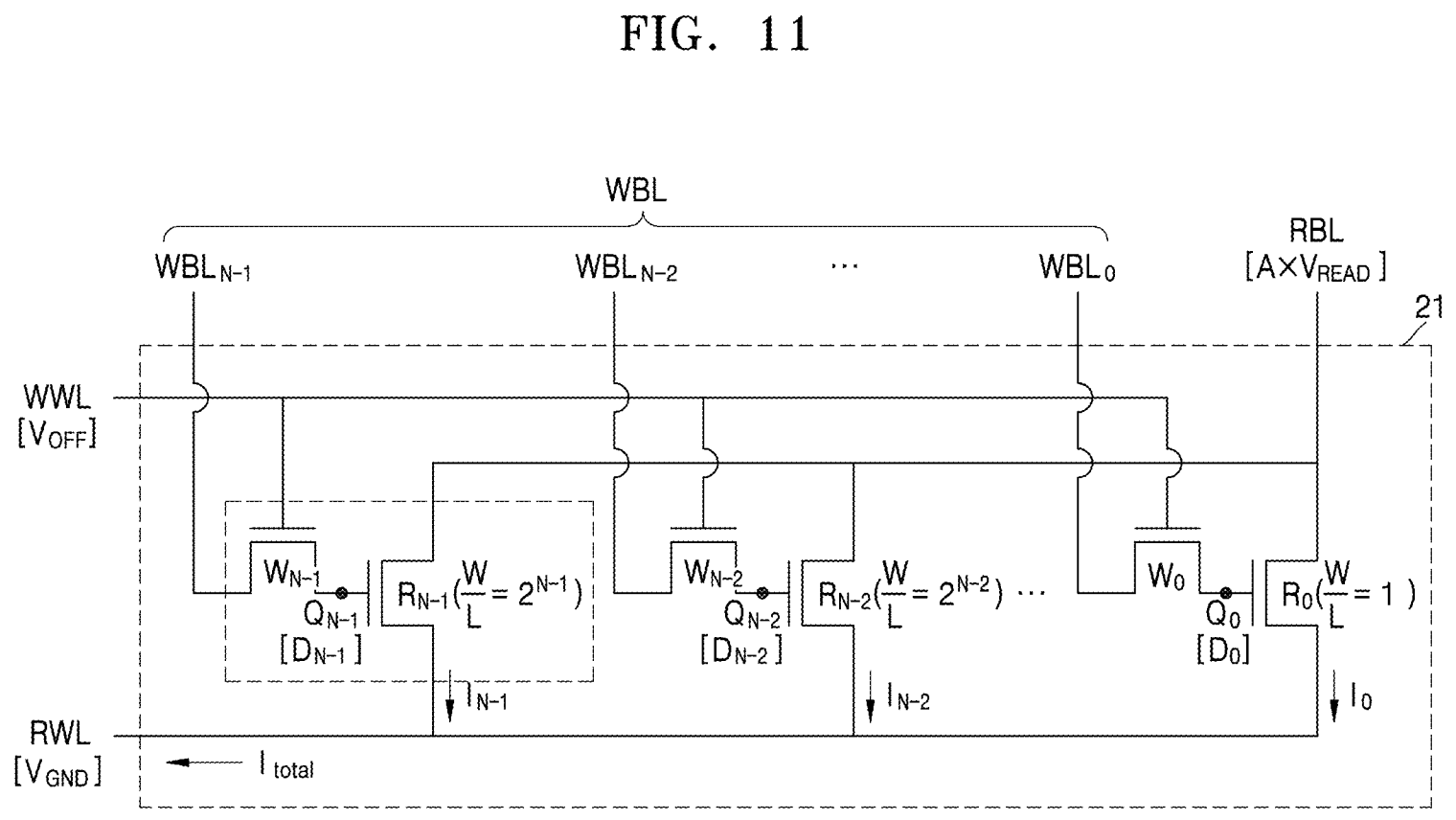
Figure 12:
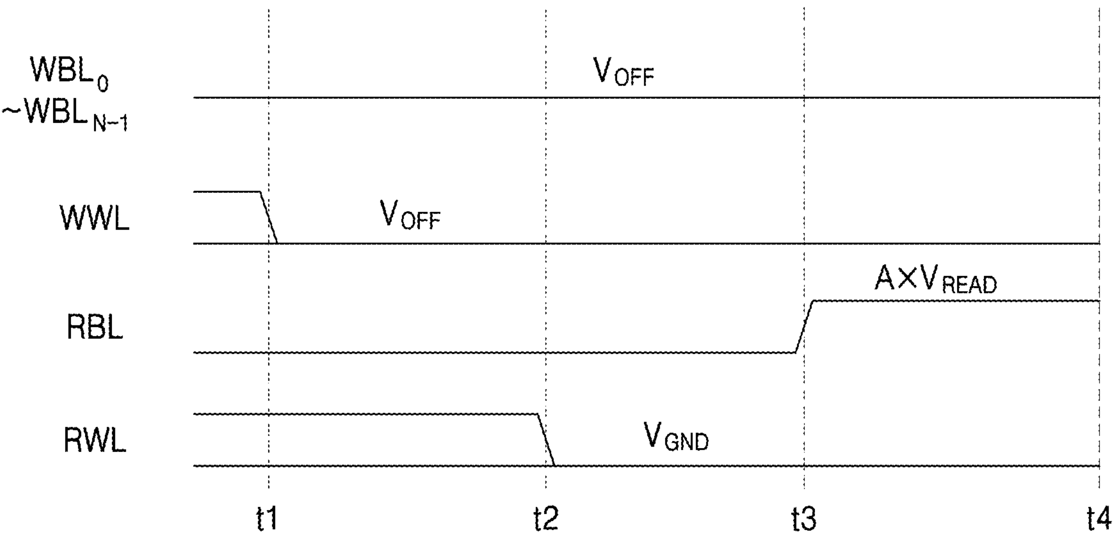
FIG. 12 is a timing diagram explaining the multiplication operation of FIG. 11 according to an embodiment.

FIG. 11 is a circuit diagram illustrating a multiplication operation according to an embodiment. FIG. 12 is a timing diagram explaining the multiplication operation of FIG. 11 according to an embodiment.

Referring to FIG. 11, during a multiplication operation, the BLSA 26 may apply a voltage having a magnitude proportional to the second operation target data, 'A', to the read bit line RBL. For example, the BLSA 26 may apply $A \times V_{READ}$ to the read bit line RBL. The magnitude of $A \times V_{READ}$ may be included in the drain voltage range where the read transistors $R_0$ to $R_{N-1}$ operate in a linear region. Therefore, the read transistors $R_0$ to $R_{N-1}$ may output a current proportional to $A \times V_{READ}$. For example, $A \times V_{READ}$ may be less than the value obtained by subtracting the threshold voltage $V_{th}$ of the read transistors $R_0$ to $R_{N-1}$ from the positive supply voltage VDD. In some embodiments, the level of $V_{READ}$ may be pre-recorded in an internal register (not shown) at boot time or during manufacturing of the memory device 20. In some embodiments, the level of $V_{READ}$ may be pre-written into an internal register (not shown) at booting or during manufacturing of the memory device 20 so that the level of $V_{READ}$ may be variably adjusted depending on the value of 'A'.

The turn-on current $I_i$ output from the read transistor $R_i$ among the read transistors $R_0$ to $R_{N-1}$ may be expressed as in Equation 1 (i is an integer greater than or equal to 0 and less than or equal to N−1).

$$I_i = [D_i \times [(2^i \frac{W}{L})(VDD - Vth)(A \times V_{READ})] = D_i \times 2^i \times A \times [\frac{W}{L}(VDD - Vth)V_{READ}] \quad \text{[Equation 1]}$$

Here, $D_i$ may be data ('1' or '0') stored in a storage node $Q_i$, W may be a channel width of the read transistor $R_i$, and L may be a channel length of the read transistor $R_i$.

Herein, in all the Equations presented in the present specification, the current from the read transistor is described in a form in which the product of electron mobility (μ) and the gate oxide film capacitance (Cox) is considered to be 1 and is omitted for simplicity. This is to explain the relative current change under certain conditions, and an actual current model considering mobility and capacitance should be used in an actual design or simulation. For example, in Equations, "W/L (VDD−Vth) $V_{READ}$" may be referred to as "W/L μCox (VDD−Vth) $V_{READ}$."

In the embodiment of the IMM 21' of FIG. 4B, $I_i$ may mean the current provided from the read transistor group $RG_i$ to the read word line RWL.

The total current $I_{total}$, which is the sum of the turn-on currents output from the read transistors $R_0$ to $R_{N-1}$, may be expressed as in Equation 2.

$$I_{total} = I_{N-1} + I_{N-2} + \ldots + I_0 = \left[D_{N-1} \times 2^{N-1} + D_{N-2} \times 2^{N-2} + \ldots + D_0 \times 2^0\right] \times A \times \left[\frac{W}{L}(VDD - Vth)V_{READ}\right] = [D_{N-1}D_{N-2} \ldots D_0]_2 \times A \times [\frac{W}{L}(VDD - Vth)V_{READ}] \quad \text{[Equation 2]}$$

For example, the current value of the total current $I_{total}$ may be proportional to the product of the binary number $[D_{N-1} D_{N-2} \ldots D_0]_2$, which is the first operation target data stored in the IMM 21, and 'A', which is the second operation target data.

In the embodiment of the IMM 21' of FIG. 4B, $I_{total}$ may mean the sum of currents provided from the first to Nth read transistor groups $RG_0$ to $RG_{N-1}$ to the read word line RWL.

Referring again to FIG. 5, the ADC 24 may obtain the result value of the multiplication operation of the first operation target data and the second operation target data by generating the digital output signal b1 to bm for the total current $I_{total}$ provided through the read word line RWL.

Referring to FIG. 12, at a first time point t1, the word line driver 25 may apply the off-voltage $V_{OFF}$ to the write word line WWL. Therefore, the write transistors $W_0$ to $W_{N-1}$ may be turned off.

At a second time point t2, the word line driver 25 may apply a ground voltage $V_{GND}$ to the read word line RWL.

At a third time point t3, the BLSA 26 may apply a voltage proportional to the magnitude of the second operation target data, 'A', to the read bit line RBL. For example, the BLSA 26 may apply a voltage having a magnitude of $A \times V_{READ}$ to the read bit line RBL.

Although it is illustrated that an off-voltage $V_{OFF}$ is applied to the write bit lines $WBL_0$ to $WBL_{N-1}$ during the first time point t1 to a fourth time point t4, the invention is not limited thereto. For example, depending on the data stored in the storage node, the voltage level applied to the write bit line may vary. In detail, when '0' is stored in the storage node, the off-voltage $V_{OFF}$ may be applied to the corresponding write bit line, and when '1' is stored in the storage node, the on-voltage $V_{ON}$ may be applied to the corresponding write bit line.

Figure 13:
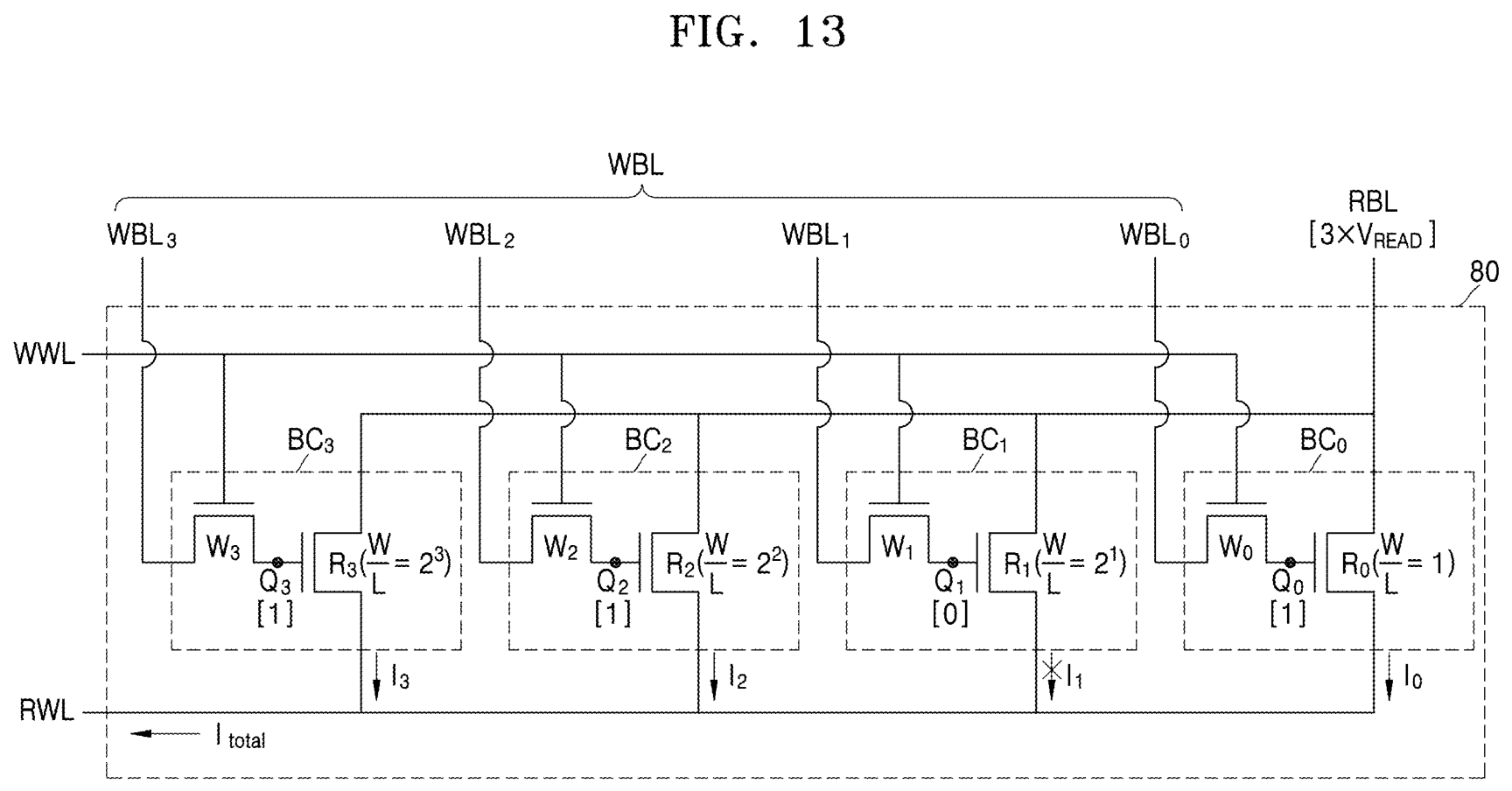

FIG. 13 is a circuit diagram illustrating a multiplication operation between binary number $\mathbf{1101_2}$ and decimal 3 according to an embodiment.

As described above with reference to FIGS. 8 and 9, the binary number $\mathbf{1101_2}$ may be stored in an IMM 80 of FIG. 13.

As at the third time point t3 of FIG. 12, the BLSA 26 may apply a voltage having a magnitude of $3 \times V_{READ}$ to the read bit line RBL.

Because '0' is stored in the storage node $Q_1$, the read transistor $R_1$ may be turned off and the turn-on current $I_1$ of the read transistor $R_1$ may not be generated.

Therefore, as described in Equation 3, the total current $I_{total}$ may be the sum of the turn-on currents $I_0$, $I_2$, and $I_3$ of the read transistors $R_0$, $R_2$, and $R_3$.

[Equation 3]

$$I_{total} = I_3 + I_2 + I_0 = \left[D_3 \times 2^3 + D_2 \times 2^2 + D_1 \times 2^1 + D_0 \times 2^0\right] \times A \times I_{ref} = [1101]_2 \times A \times I_{ref1}$$

Here, $I_{ref1}$ may have a value corresponding to $$\frac{W}{L}(VDD - Vth)V_{READ}$$

in Equation 1 and Equation 2. As described above with reference to FIGS. 11 to 13, the IMM 21 and the IMM 80 may perform a multiplication operation based on the magnitude of the voltage applied to the read bit line RBL.

Figure 15:
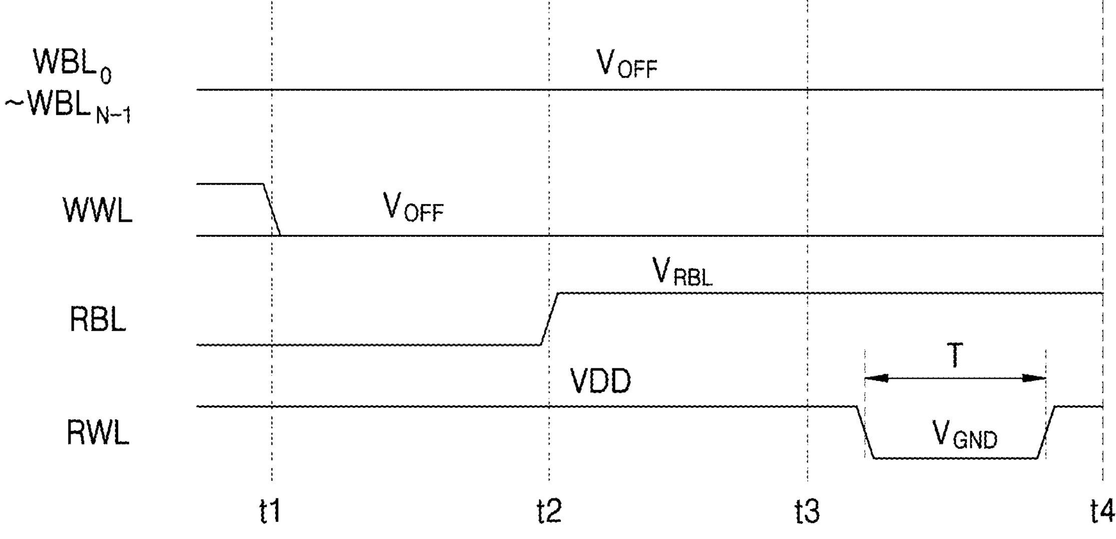
FIG. 15 is a timing diagram illustrating the multiplication operation of FIG. 14 according to an embodiment.

FIG. 14 is a circuit diagram illustrating a multiplication operation according to an embodiment. FIG. 15 is a timing diagram illustrating the multiplication operation of FIG. 14 according to an embodiment.

Referring to FIG. 14, during a multiplication operation, the BLSA 26 may apply a read bit line voltage $V_{RBL}$ to a read bit line RBL. The word line driver 25 may apply a negative pulse voltage to the read word line RWL, of which the voltage level is lowered from the positive power supply voltage VDD level to the ground voltage $V_{GND}$ level during a time period 'T', which is the second operation target data.

The sum of the turn-on currents $I_i$ output from a read transistor $R_i$ among the read transistors $R_0$ to $R_{N-1}$ for the time period 'T' may be expressed as in Equation 4 (i is an integer greater than or equal to 0 and less than or equal to N−1).

[Equation 4]

$$\text{sum of } I_i \text{ for } T = T \times D_i \times [(2^i \frac{W}{L}(VDD - Vth)V_{RBL}] = D_i \times 2^i \times T \times \left[\frac{W}{L}(VDD - Vth)V_{RBL}\right] = D_i \times 2^i \times T \times I_{ref2}$$

The sum of the total turn-on current $I_{total}$ output from the read transistors $R_0$ to $R_{N-1}$ during the time period 'T' may be expressed as in Equation 5.

[Equation 5]

$$\text{sum of } I_{total} \text{ for } T - \text{sum of } I_{N-1} + \text{sum of } I_{N-2} + \ldots + \text{sum of } I_0 = \left[D_{N-1} \times 2^{N-1} + D_{N-2} \times 2^{N-2} + \ldots + D_0 \times 2^0\right] \times T \times I_{ref2} = [D_{N-1} D_{N-2} \ldots D_0]_2 \times T \times I_{ref2}$$

For example, during the time period 'T', the sum magnitude of the current $I_{total}$ may be proportional to the product of the binary number $[D_{N-1}\ D_{N-2}, \ldots D_0]_2$, which is the first operation target data stored in the IMM 21, and the second operation target data, 'T'.

Referring again to FIG. 5, the ADC 24 may obtain the result value of the multiplication operation of the first operation target data and the second operation target data by generating the digital output signal b1 to bm for the sum of the current $I_{total}$ provided through the read word line RWL for the time period T.

Referring to FIG. 15, at a first time point t1, the word line driver 25 may apply an off-voltage $V_{OFF}$ to the write word line WWL. Therefore, the write transistors $W_0$ to $W_{N-1}$ may be turned off.

At a second time point t2, the BLSA 26 may apply the read bit line voltage $V_{RBL}$ to the read bit line RBL. The read bit line voltage $V_{RBL}$ may be within a voltage range that causes the read transistors $R_0$ to $R_{N-1}$ to operate in a linear region or a saturation region.

Between a third time point t3 and a fourth time point t4, the word line driver 25 may apply a ground voltage $V_{GND}$ to the read word line RWL for a time period proportional to a size or length of the second operation target data, 'T'. For example, the word line driver 25 may apply a negative pulse voltage having a length of the time period 'T'. Herein, the time period 'T' may be referred to as a pulse time period.

Although it is illustrated that an off-voltage $V_{OFF}$ is applied to the write bit lines $WBL_0$ to $WBL_{N-1}$ during a first time point t1 to a fourth time point t4, the invention is not limited thereto. For example, depending on the data stored in the storage node, the voltage level applied to the write bit line may vary. In detail, when '0' is stored in the storage node, the off-voltage may be applied to the corresponding write bit line, and when '1' is stored in the storage node, the on-voltage may be applied to the corresponding write bit line.

Figure 16:
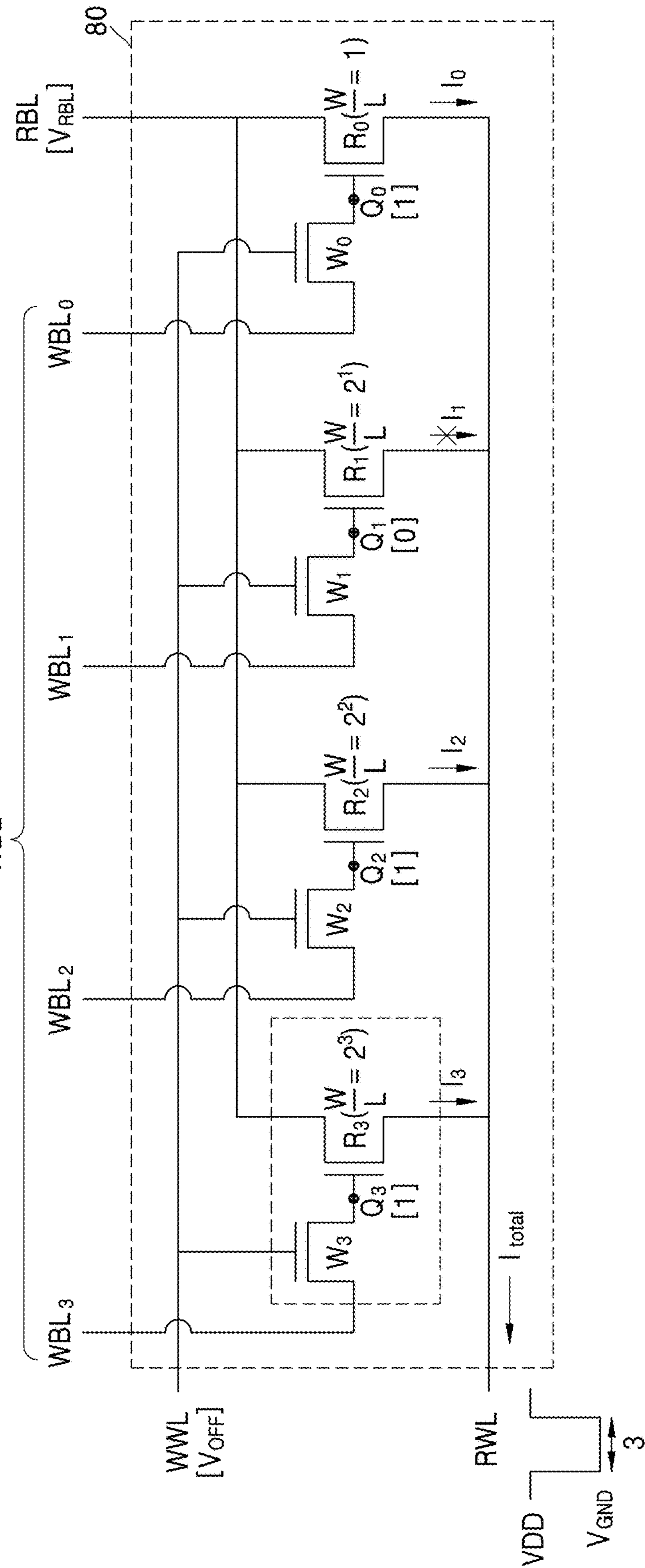
FIG. 16 is a circuit diagram illustrating a multiplication operation between binary number and decimal number according to an embodiment.

FIG. 16 is a circuit diagram illustrating a multiplication operation between binary number $\mathbf{1101_2}$ and decimal 3 according to an embodiment.

As described above with reference to FIGS. 8 and 9, the binary number $\mathbf{1101_2}$ may be stored in the IMM 80 of FIG. 16.

As in the time period between the third time point t3 and the fourth time point t4 of FIG. 15, the word line driver 25 may apply a negative pulse voltage having a ground voltage $V_{GND}$ level to the read word line RWL for a time period corresponding to '3'. For example, the word line driver 25 may apply the negative pulse voltage having a length corresponding to '3'.

Because '0' is stored in the storage node $Q_1$, the read transistor $R_1$ may be turned off and the turn-on current $I_1$ of the read transistor $R_1$ may not be generated.

Therefore, the sum of the total current $I_{total}$ during a time period T may be expressed as Equation 6.

$$\text{sum of } I_{total} \text{ for } T = \text{sum of } I_3 + \text{sum of } I_2 + \text{sum of } I_0 = \left[D_3 \times 2^3 + D_2 \times 2^2 + D_0 \times 2^0\right] \times T \times I_{ref2} = [1101]_2 \times T \times I_{ref2} \quad \text{[Equation 6]}$$

Here, $I_{ref2}$ may have a value corresponding to $$\left[\frac{W}{L}(VDD - Vth)V_{RBL}\right]$$

in Equations 4 and 5.

As described above with reference to FIGS. 14 to 16, the IMM 21 and the IMM 80 may perform a multiplication operation based on the length of a pulse applied to the read word line RWL.

Figure 17:
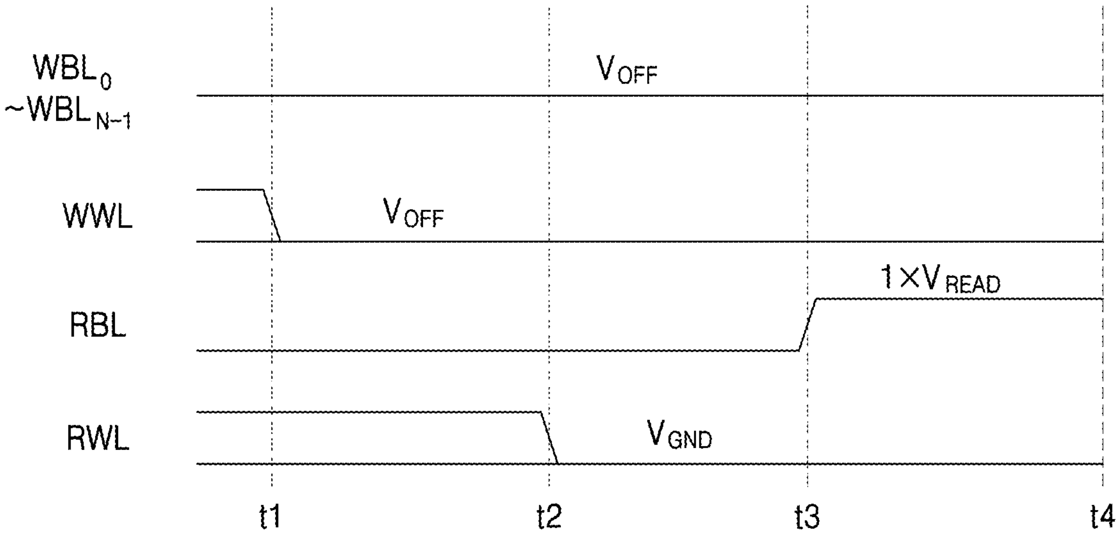
FIGS. 17 and 18 are timing diagrams explaining read operations according to example embodiments.
Figure 18:
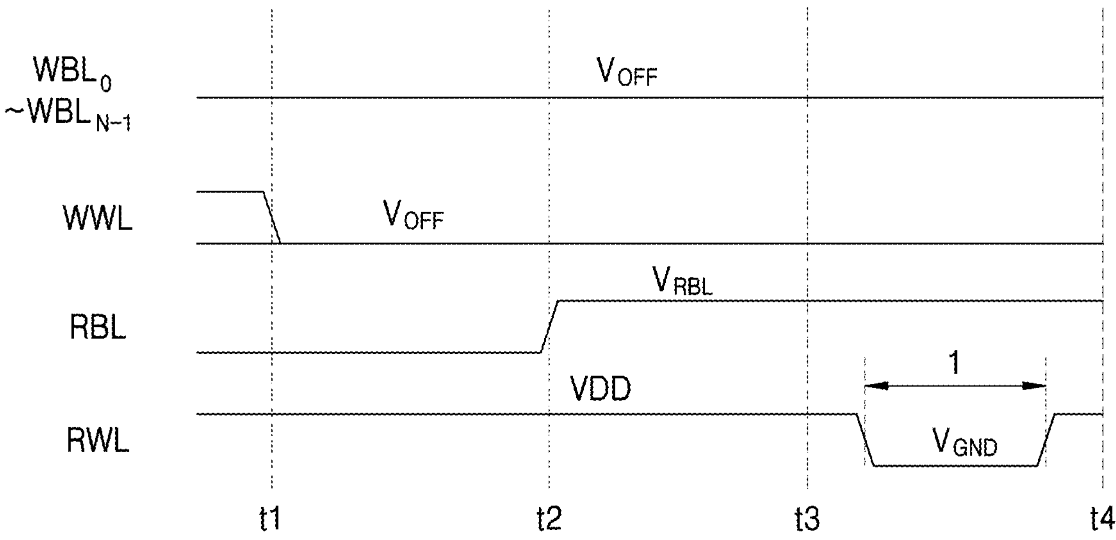

FIGS. 17 and 18 are timing diagrams explaining read operations according to example embodiments. FIG. 17 may be explained with reference to FIG. 12, and FIG. 18 may be explained with reference to FIG. 15.

Referring to FIG. 17, unlike FIG. 12, at the third time point t3, the BLSA 26 may apply a voltage having a magnitude of $1 \times V_{READ}$ to the read bit line RBL.

Therefore, the sum $I_{total}$ of the turn-on currents output from the read transistors $R_0$ to $R_{N-1}$ may be expressed as in Equation 7.

$$I_{total} = I_{N-1} + I_{N-2} + \ldots + I_0 = \left[D_{N-1} \times 2^{N-1} + D_{N-2} \times 2^{N-2} + \ldots + D_0 \times 2^0\right] \times 1 \times \left[\frac{W}{L}(VDD - Vth)V_{READ}\right] = [D_{N-1}D_{N-2} \ldots D_0]_2 \times I_{ref1} \quad \text{[Equation 7]}$$

For example, the total current $I_{total}$ may have a magnitude corresponding to the multiplication between the first operation target data stored in the IMM 21 and $I_{ref1}$.

Referring again to FIG. 5, the ADC 24 may generate the digital output signal b1 to bm for the current $I_{total}$ provided through the read word line RWL. The digital output signal b1 to bm may represent the same value as the first operation target data $[D_{N-1}\ D_{N-2} \ldots D_0]_2$.

Referring to FIG. 18, unlike in FIG. 15, at the third time point t3, the word line driver 25 may apply a negative pulse voltage having the ground voltage $V_{GND}$ level to the read word line RWL for a time period corresponding to 1. For example, the word line driver 25 may apply the negative pulse voltage having a length corresponding to '1'.

Therefore, the sum of $I_{total}$ provided through the read word line RWL during the time period corresponding to 1 may be expressed as in Equation 8.

$$\text{sum of } I_{total} \text{ for } 1 = \text{sum of } I_{N-1} + \text{sum of } I_{N-2} + \ldots + \text{sum of } I_0 = \left[D_{N-1} \times 2^{N-1} + D_{N-2} \times 2^{N-2} + \ldots + D_0 \times 2^0\right] \times T \times I_{ref2} = [D_{N-1}D_{N-2} \ldots D_0]_2 \times I_{ref2} \quad \text{[Equation 8]}$$

For example, the sum of the total current $I_{total}$ may have a magnitude corresponding to the multiplication between the first operation target data stored in the IMM 21 and $I_{ref2}$.

Referring again to FIG. 5, the ADC 24 may generate the digital output signal b1 to bm for the sum of the total current $I_{total}$ provided through the read word line RWL. The digital output signal b1 to bm may represent the same value as the first operation target data $[D_{N-1}\ D_{N-2} \ldots D_0]_2$.

While the inventive concept has been particularly shown and described with reference to embodiments thereof, it will be understood that various changes in form and details may be made therein without departing from the spirit and scope of the present invention as set forth in the following claims.

What is claimed is:

1. A memory device comprising: an in-memory operation circuit connected to a write word line, a plurality of write bit lines, a read word line, and a read bit line, and including a plurality of bit cells; wherein each of the plurality of bit cells comprises: a first transistor having a first end connected to a corresponding write bit line among the plurality of write bit lines, a second end connected to a storage node, and a gate terminal connected to the write word line; and at least one second transistor having a first end connected to the read bit line, a second end connected to the read word line, and a gate terminal connected to the storage node, wherein a current value of a turn-on current of the at least one second transistor included in each of the plurality of bit cells corresponds to a value obtained by multiplying a reference current value by a power of 2, and wherein the power of 2 is different for each of the plurality of bit cells.

2. The memory device of claim 1, wherein a channel width-length ratio of the at least one second transistor included in each of the plurality of bit cells corresponds to a value obtained by multiplying a reference channel width-length ratio by a corresponding power of 2.

3. The memory device of claim 1, wherein each of the plurality of bit cells includes a number of the second transistors corresponding to a corresponding power of 2, and the number of the second transistors included in each of the plurality of bit cells is different from each other.

4. The memory device of claim 1, further comprising:

a bit line sense amplifier configured to provide voltages to the plurality of write bit lines and the read bit line; and a word line driver configured to provide voltages to the write word line and the read word line.

5. The memory device of claim 4, wherein, when performing a write operation on first operation target data, the memory device is configured such that:

the bit line sense amplifier applies a first write bit line voltage or a second write bit line voltage different from the first write bit line voltage to the plurality of write bit lines depending on the first operation target data in a first time period, and the word line driver applies an on-voltage to the write word line in a second time period and applies an off-voltage to the write word line in a third time period.

6. The memory device of claim 5, wherein, during the first to third time periods, the memory device is further configured such that:

the bit line sense amplifier applies a ground voltage to the read bit line, and the word line driver applies the ground voltage to the read word line.

7. The memory device of claim 5, wherein the memory device is further configured such that:

the bit line sense amplifier applies a first precharge voltage to the read bit line during at least a portion of the first to third time periods, the word line driver applies a second precharge voltage to the read word line during at least a portion of the first to third time periods, and wherein each of the first and second precharge voltages is different from a ground voltage.

8. The memory device of claim 5, wherein the memory device is further configured such that:

in a fourth time period, the bit line sense amplifier precharges a plurality of write bit lines to a precharge voltage greater than a ground voltage, in a fifth time period, the word line driver applies an on-voltage to the write word line, in a sixth time period, the word line driver applies the off-voltage to the write word line, and the bit line sense amplifier applies the first write bit line voltage or the second write bit line voltage to the plurality of write bit lines by amplifying voltage levels of the plurality of write bit lines, in a seventh time period, the word line driver applies the on-voltage to the write word line, and in an eighth time period, the word line driver applies the off-voltage to the write word line.

9. The memory device of claim 4, wherein, when performing a multiplication operation between first operation target data stored in the storage nodes of the plurality of bit cells, and second operation target data, the memory device is configured such that:

in a first time period, the word line driver applies an off-voltage to the write word line, in a second time period, the word line driver applies a ground voltage to the read word line, and in a third time period, the bit line sense amplifier applies a voltage having a magnitude proportional to the second operation target data to the read bit line.

10. The memory device of claim 4, wherein, when performing a read operation on first operation target data stored in the storage nodes of the plurality of bit cells, the memory device is configured such that:

in a first time period, the word line driver applies an off-voltage to the write word line, in a second time period, the word line driver applies a ground voltage to the read word line, and in a third time period, the bit line sense amplifier applies a predetermined read voltage to the read bit line.

11. The memory device of claim 4, wherein, when performing a multiplication operation between first operation target data stored in the storage nodes of the plurality of bit cells, and second operation target data, the memory device is configured such that:

in a first time period, the word line driver applies an off-voltage to the write word line, in a second time period, the bit line sense amplifier applies a read bit line voltage to the read bit line, and in a third time period, the word line driver applies, to the read word line, a pulse voltage that maintains a level of a ground voltage for a pulse time period having a length proportional to the second operation target data.

12. The memory device of claim 11, wherein, in a time period other than the pulse time period within the third time period, the pulse voltage includes a positive power supply voltage level.

13. The memory device of claim 4, wherein, when performing a read operation on first operation target data stored in the storage nodes of the plurality of bit cells, the memory device is configured such that:

in a first time period, the word line driver applies an off-voltage to the write word line, in a second time period, the bit line sense amplifier applies a read bit line voltage to the read bit line, and in a third time period, the word line driver applies a pulse voltage to the read word line, which maintains a level of a ground voltage for a time period having a length corresponding to a value of '1'.

14. The memory device of claim 1, further comprising:

an analog-to-digital converter configured to receive currents of a plurality of second transistors included in the plurality of bit cells from the read word line and generate a digital output signal based on current values of the currents.

15. A method of operating a memory device including a plurality of bit cells, each of which includes a first transistor and at least one second transistor, the first transistor having a first end connected to a corresponding write bit line among a plurality of write bit lines, a second end connected to a storage node, and a gate terminal connected to a write word line; and the at least one second transistor having a first end connected to a read bit line, a second end connected to a read word line, and a gate terminal connected to the storage node and providing a different turn-on current of each of the plurality of bit cells, the method comprising: performing a multiplication operation of first operation target data stored in the storage nodes of the plurality of bit cells, and second operation target data, wherein the performing of the multiplication operation includes: applying an off-voltage to the write word line in a first time period; applying a ground voltage to the read word line in a second time period; and applying a voltage having a magnitude associated with the second operation target data to the read bit line in a third time period.

16. The method of claim 15, further comprising:

performing a write operation on the first operation target data, wherein the performing of the write operation includes:

in a fourth time period, applying a first write bit line voltage or a second write bit line voltage to the plurality of write bit lines depending on the first operation target data;

in a fifth time period, applying an on-voltage to the write word line; and in a sixth time period, applying the off-voltage to the write word line.

17. The method of claim 16, wherein the performing of the write operation further includes:

applying the ground voltage to the read bit line and the read word line during the fourth to sixth time periods.

18. The method of claim 16, wherein the performing of the write operation further includes:

applying a first precharge voltage to the read bit line during at least a portion of the fourth to sixth time periods; and applying a second precharge voltage to the read word line during at least a portion of the fourth to sixth time periods, and wherein each of the first and second precharge voltages is different from the ground voltage.

19. The method of claim 15, further comprising:

generating result data corresponding to a result of the multiplication operation of the first operation target data and the second operation target data based on a magnitude of the turn-on currents of the plurality of second transistors included in the plurality of bit cells provided from the read word line.

20. A method of operating a memory device including a plurality of bit cells, each of which includes a first transistor and at least one second transistor, the first transistor having a first end connected to a corresponding write bit line among a plurality of write bit lines, a second end connected to a storage node, and a gate terminal connected to a write word line; and the at least one second transistor having a first end connected to a read bit line, a second end connected to a read word line, and a gate terminal connected to the storage node and providing a different turn-on current of each of the plurality of bit cells, the method comprising: performing a multiplication operation of first operation target data stored in the storage nodes of the plurality of bit cells, and second operation target data, wherein the performing of the multiplication operation includes: applying an off-voltage to the write word line in a first time period; applying a read bit line voltage to the read bit line in a second time period; and applying a pulse voltage to the read word line, the pulse voltage maintaining a level of a ground voltage for a pulse time period having a length proportional to a size of the second operation target data in a third time period.

* * * * *